United States Patent
Yamazaki et al.

(10) Patent No.: US 9,331,306 B2
(45) Date of Patent: May 3, 2016

(54) ORGANIC OPTICAL DEVICE AND PROTECTIVE COMPONENT OF ORGANIC OPTICAL DEVICE

(75) Inventors: Shunpei Yamazaki, Tokyo (JP); Hisao Ikeda, Kanagawa (JP); Kengo Akimoto, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 238 days.

(21) Appl. No.: 13/302,213

(22) Filed: Nov. 22, 2011

(65) Prior Publication Data

US 2012/0126270 A1 May 24, 2012

(30) Foreign Application Priority Data

Nov. 24, 2010 (JP) ................. 2010-261784

(51) Int. Cl.
*H01L 51/52* (2006.01)
*H01L 27/32* (2006.01)

(52) U.S. Cl.
CPC ........ *H01L 51/5253* (2013.01); *H01L 51/5275* (2013.01); *H01L 27/3258* (2013.01)

(58) Field of Classification Search
CPC ............ H01L 27/3258; H01L 51/5237; H01L 51/5253
See application file for complete search history.

(56) References Cited

U.S. PATENT DOCUMENTS

| | | | |
|---|---|---|---|
| 7,164,155 B2 | 1/2007 | Yamazaki et al. | |
| 7,271,411 B2 | 9/2007 | Koyama et al. | |
| 7,675,074 B2 | 3/2010 | Yamazaki et al. | |
| 7,859,627 B2 | 12/2010 | Nishida et al. | |
| 8,115,883 B2 | 2/2012 | Yamazaki et al. | |
| 8,129,715 B2 | 3/2012 | Yamazaki et al. | |
| 8,476,623 B2 | 7/2013 | Yamazaki et al. | |
| 8,488,077 B2 | 7/2013 | Yamazaki et al. | |
| 8,492,764 B2 | 7/2013 | Yamazaki et al. | |
| 8,529,990 B2 | 9/2013 | Fedorovskaya et al. | |
| 8,659,012 B2 | 2/2014 | Yamazaki et al. | |
| 8,698,970 B2 | 4/2014 | Yamazaki et al. | |

(Continued)

FOREIGN PATENT DOCUMENTS

JP 2005-335067 A 12/2005
JP 2007-173424 7/2007

(Continued)

OTHER PUBLICATIONS

Reineke, S. et al, "White Organic Light-Emitting Diodes with Fluorescent Tube Efficiency," Nature, vol. 459, May 14, 2009, pp. 234-239.

*Primary Examiner* — Benjamin Sandvik
(74) *Attorney, Agent, or Firm* — Husch Blackwell LLP

(57) ABSTRACT

An organic optical device which can suppress deterioration due to moisture or an impurity is provided. An organic optical device includes a supporting body, a functional layer provided over the supporting body, and a light-emitting body containing an organic compound provided over the functional layer. The functional layer includes an insulating film containing gallium or aluminum, zinc, and oxygen. The supporting body and the functional layer each have a property of transmitting light with a wavelength of greater than or equal to 400 nm and less than or equal to 700 nm. By using the insulating film containing gallium or aluminum, zinc, and oxygen as a protective film, entry of moisture or an impurity into an organic compound or a metal material can be suppressed.

23 Claims, 9 Drawing Sheets

(56) References Cited

U.S. PATENT DOCUMENTS

| | | |
|---|---|---|
| 8,853,724 B2 | 10/2014 | Seo et al. |
| 8,879,011 B2 | 11/2014 | Yamazaki et al. |
| 8,912,541 B2 | 12/2014 | Yamazaki et al. |
| 8,994,889 B2 | 3/2015 | Yamazaki et al. |
| 9,118,025 B2 | 8/2015 | Yamazaki et al. |
| 2005/0181535 A1* | 8/2005 | Yun et al. ............ 438/99 |
| 2005/0258436 A1 | 11/2005 | Arai |
| 2007/0170852 A1* | 7/2007 | Yamada et al. .......... 313/506 |
| 2008/0129184 A1 | 6/2008 | Nishida et al. |
| 2008/0129933 A1 | 6/2008 | Nishida et al. |
| 2008/0130122 A1 | 6/2008 | Egi et al. |
| 2008/0266661 A1* | 10/2008 | Nakamura ............ 359/485 |
| 2009/0081356 A1 | 3/2009 | Fedorovskaya et al. |
| 2009/0091258 A1* | 4/2009 | Heuser ............ H01L 33/50 313/512 |
| 2009/0243478 A1* | 10/2009 | Shoda et al. ............ 313/504 |
| 2010/0327304 A1* | 12/2010 | Sonoda et al. ............ 257/98 |
| 2011/0114954 A1* | 5/2011 | Lee et al. ............ 257/59 |
| 2011/0134647 A1 | 6/2011 | Nishida et al. |
| 2015/0054014 A1 | 2/2015 | Seo et al. |
| 2015/0179675 A1 | 6/2015 | Yamazaki et al. |

FOREIGN PATENT DOCUMENTS

| | | |
|---|---|---|
| JP | 2009-016305 A | 1/2009 |
| JP | 2010-541159 | 12/2010 |
| WO | WO 2008/122780 A2 | 10/2008 |
| WO | WO 2009/042052 A2 | 4/2009 |

* cited by examiner

ORGANIC OPTICAL DEVICE AND PROTECTIVE COMPONENT OF ORGANIC OPTICAL DEVICE

BACKGROUND OF THE INVENTION

1. Field of the Invention

An embodiment of the present invention relates to an organic optical device provided with a light-emitting body which contains an organic compound. In addition, an embodiment of the present invention relates to a protective component of an organic optical device and an organic optical device provided with the protective component.

In this specification, an organic optical device refers to an element or a device in general which is provided with a light-emitting body containing an organic compound. Examples of the organic optical device include a light-emitting element containing a light-emitting organic compound like an element utilizing an organic electroluminescence (EL) phenomenon (the element is also referred to as an organic EL element) and a wavelength conversion element. The organic optical device also includes a light-emitting device, an electronic device, and a lighting device each including such a light-emitting element in its category.

2. Description of the Related Art

An organic EL element which is an example of the organic optical device has been actively researched and developed. In the fundamental structure of the organic EL element, a layer containing a light-emitting organic compound is sandwiched between a pair of electrodes. By applying voltage to this element, light emission from the light-emitting organic compound can be obtained.

The organic EL element can be formed into a film shape and thus a large-area element can easily be formed. Therefore, utility value of the organic EL element as a surface light source that can be applied to lighting or the like is also high.

In Patent Document 1, an organic optical device including an organic thin film transistor and an organic EL element is disclosed.

REFERENCE

Patent Document

[Patent Document 1] PCT International Publication No. WO 2008/122780

SUMMARY OF THE INVENTION

An organic optical device has a problem in that the reliability is lowered owing to entry of moisture or an impurity from the outside.

When moisture or an impurity enters an organic compound or a metal material included in the organic optical device from the outside, the lifetime of the organic optical device is drastically shortened in some cases. This is because an organic compound or a metal material included in the organic optical device reacts with moisture or an impurity and deteriorates.

Therefore, it is an object of an embodiment of the present invention to provide a protective component of an organic optical device or an organic optical device which can suppress deterioration due to moisture or an impurity.

In addition, an organic optical device having high light extraction efficiency is expected.

Therefore, it is an object of an embodiment of the present invention to provide a protective component of an organic optical device or an organic optical device having high light extraction efficiency.

It is noteworthy for the inventors of the present invention to use an insulating film containing gallium or aluminum, zinc, and oxygen as a protective film of an organic optical device. By using such a film as the protective film of the organic optical device, entry of hydrogen, moisture, an impurity, or the like into an organic compound or a metal material from the outside of the organic optical device can be suppressed.

The insulating film containing gallium or aluminum, zinc, and oxygen has a property of transmitting visible light. Therefore, the insulating film does not hinder light extraction even when provided on the side where light emission of the organic optical device, which emits visible light, is extracted, and therefore is preferable.

Specifically, an organic optical device (or a protective component of an organic optical device) according to an embodiment of the present invention includes at least one insulating film containing gallium or aluminum, zinc, and oxygen as a functional layer. With such a functional layer, deterioration of an organic optical device due to moisture or an impurity can be suppressed. In addition, with such a functional layer, an organic optical device having high light extraction efficiency can be achieved.

Therefore, an embodiment of the present invention is an organic optical device including: a supporting body, a functional layer provided over the supporting body, and a light-emitting body containing an organic compound provided over the functional layer. The functional layer includes an insulating film containing gallium or aluminum, zinc, and oxygen, and the supporting body and the functional layer each have a property of transmitting light with a wavelength of greater than or equal to 400 nm and less than or equal to 700 nm.

The present invention is preferably applied to an organic EL element which is one kind of organic optical device. Therefore, an embodiment of the present invention is an organic optical device including: a supporting body, a functional layer provided over the supporting body, a first electrode provided over the functional layer, a layer containing a light-emitting organic compound provided over the first electrode, and a second electrode provided over the layer containing a light-emitting organic compound. The functional layer includes an insulating film containing gallium or aluminum, zinc, and oxygen, and the supporting body, the functional layer, and the first electrode each have a property of transmitting light with a wavelength of greater than or equal to 400 nm and less than or equal to 700 nm.

In an embodiment of the present invention, the insulating film containing gallium or aluminum, zinc, and oxygen may also contain nitrogen. In addition, in the insulating film, the total atomic proportion of elements other than gallium, aluminum, zinc, oxygen, and nitrogen is preferably less than or equal to 0.1. Further, the specific resistance of the insulating film is preferably higher than or equal to $10^{10}$ Ωcm at 20° C.

In the above structure, it is preferable that a sealing film covering the second electrode be provided, the sealing film be in contact with the functional layer, and the sealing film contain gallium or aluminum, zinc, and oxygen. The sealing film may also contain nitrogen.

By providing a film containing gallium or aluminum, zinc, and oxygen as the sealing film in contact with the functional layer, entry of hydrogen, moisture, an impurity, or the like into an organic compound or a metal material from the outside of the organic optical device can be suppressed not only on the side where light emission of the organic optical device is extracted but also on the side opposite to the light extraction side.

In an organic optical device, when light enters, from a light-emitting body, a medium whose refractive index is different from that of the light-emitting body, part of the light is reflected.

The larger a difference in refractive index between two media is, the more likely light is to be reflected, which results in reduction in light extraction efficiency of the organic optical device.

In an embodiment of the present invention, the refractive index of the functional layer is set such that reflection of light due to a difference in refractive index between two media can be reduced.

Specifically, an embodiment of the present invention is a protective component of an organic optical device, including: a functional layer including an insulating film containing gallium or aluminum, zinc, and oxygen; a first film in contact with one surface of the functional layer; and a second film in contact with the other surface of the functional layer. The protective component has a property of transmitting light with a wavelength of greater than or equal to 400 nm and less than or equal to 700 nm, and a difference in refractive index between a layer included in the functional layer and a layer in contact with the layer included in the functional layer is less than or equal to 0.2.

Since the protective component according to an embodiment of the present invention includes the insulating film containing gallium or aluminum, zinc, and oxygen, entry of moisture into an organic compound can be suppressed. In addition, a difference in refractive index between a layer in contact with the first film (a layer included in the functional layer) and the first film and a difference in refractive index between a layer in contact with the second film (a layer included in the function layer) and the second film are each less than or equal to 0.2, whereby reflection of light due to the difference in refractive index can be reduced.

In the protective component, the insulating film containing gallium or aluminum, zinc, and oxygen may also contain nitrogen. In addition, in the insulating film, the total atomic proportion of elements other than gallium, aluminum, zinc, oxygen, and nitrogen is preferably less than or equal to 0.1. Further, the specific resistance of the insulating film is preferably higher than or equal to $10^{10}$ $\Omega$cm at 20° C.

Further, an embodiment of the present invention is an organic optical device to which the above protective component is applied. Specifically, the organic optical device includes: the protective component of an organic optical device, and a light-emitting body containing an organic compound provided over the protective component of an organic optical device.

The present invention is preferably applied to an organic EL element which is one kind of organic optical device. Therefore, an embodiment of the present invention is an organic optical device including: the protective component of an organic optical device, a layer containing a light-emitting organic compound provided over the protective component of an organic optical device, and a second electrode provided over the layer containing a light-emitting organic compound. The second film functions as a first electrode.

In the above organic optical device, it is preferable that a sealing film covering the second electrode be provided, the sealing film be in contact with the functional layer, and the sealing film contain gallium or aluminum, zinc, and oxygen. The sealing film may also contain nitrogen.

By providing a film containing gallium or aluminum, zinc, and oxygen as the sealing film in contact with the functional layer, entry of moisture or an impurity into a metal material used for the electrode or the like or the organic compound can be suppressed not only on the side where light emission of the organic optical device is extracted but also on the side opposite to the light extraction side.

The organic optical device emits light in a region where its refractive index is higher than that of the air. Therefore, when light is extracted to the air, total reflection is caused inside the organic optical device or at the boundary between the organic optical device and the air under a certain condition, which results in a light extraction efficiency of lower than 100%.

Specifically, the refractive index of a medium A is higher than the refractive index of a medium B and the refractive index of the medium B is lower than the refractive index of a light-emitting body (or a layer containing a light-emitting organic compound); when light enters the medium B from the medium A, total reflection is caused in some cases depending on the incidence angle.

At this time, it is preferable that an uneven structure be provided at the interface between the medium A and the medium B. With such a structure, a phenomenon can be suppressed, in which light entering the medium B from the medium A at an incidence angle exceeding a critical angle is totally reflected and the wave of the light propagates inside the device to lower the light extraction efficiency.

In the case of the organic EL element, when the first electrode which is the second film of the protective component has an uneven structure, leakage current might be generated in the layer containing a light-emitting organic compound or the like formed over the first electrode.

Therefore, in the organic optical device, the refractive indexes of the layer included in the functional layer, the first film, and the second film are preferably higher than or equal to the refractive index of the light-emitting body (or the layer containing a light-emitting organic compound). In this manner, total reflection of light inside the protective component can be reduced. In addition, it is not necessary to provide an uneven structure for suppressing a phenomenon in which the light extraction efficiency is lowered, at the interface between the second film and the layer containing a light-emitting organic compound, the interface between the second film and the functional layer, and, the interface between the functional layer and the first film; thus, the second film can be flat, which can suppress generation of leakage current in the layer containing a light-emitting organic compound or the like, which is caused by unevenness of the second film.

In addition, in the organic optical device, in the case where the first film is in contact with the air, an uneven structure is preferably provided at the interface between the first film and the air. The refractive index of the first film is higher than the refractive index of the air. Therefore, when an uneven structure is provided at the interface between the air and the first film, light which cannot be extracted to the air owing to total reflection can be reduced, and the light extraction efficiency of the organic optical device can be improved.

In accordance with an embodiment of the present invention, it is possible to provide a protective component of an organic optical device or an organic optical device which can suppress deterioration due to moisture or an impurity.

In addition, in accordance with an embodiment of the present invention, it is possible to provide a protective component of an organic optical device or an organic optical device having high light extraction efficiency.

DETAILED DESCRIPTION OF THE INVENTION

Figure 1A:
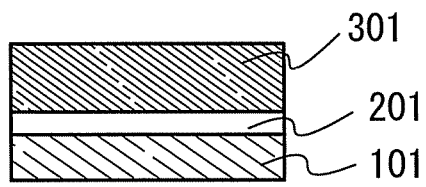
FIGS. 1A to 1C each illustrate an organic optical device according to an embodiment of the present invention.

Embodiments and Examples will be described in detail with reference to the accompanying drawings. Note that the present invention is not limited to the following description, and it will be easily understood by those skilled in the art that modes and details thereof can be modified in various ways without departing from the spirit and the scope of the present invention. Therefore, the present invention should not be construed as being limited to the description in the following embodiments and examples. Note that in the structures of the invention described below, the same portions or portions having similar functions are denoted by the same reference numerals in different drawings, and description of such portions is not repeated.

(Embodiment 1)

In this embodiment, an organic optical device according to an embodiment of the present invention will be described with reference to FIGS. 1A to 1C.

An organic optical device illustrated in FIG. 1A includes a supporting body 101, a functional layer 201, and a light-emitting body 301 containing an organic compound. Specifically, the functional layer 201 is provided over the supporting body 101, and the light-emitting body 301 is provided over the functional layer 201.

The supporting body 101 and the functional layer 201 are provided on the side where light from the light-emitting body 301 containing an organic compound is extracted. The supporting body 101 and the functional layer 201 each have a property of transmitting of light with a wavelength of greater than or equal to 450 nm and less than or equal to 650 nm, preferably greater than or equal to 400 nm and less than or equal to 700 nm.

<Functional Layer>

The functional layer 201 includes an insulating film containing gallium (Ga) or aluminum (Al), zinc (Zn), and oxygen (O).

The insulating film may also contain nitrogen (N). By using the insulating film as a protective film of the organic optical device, entry of moisture or an impurity into an organic compound or a metal material can be suppressed.

In the insulating film containing Ga or Al, Zn, and O, the total atomic proportion of Ga, Al, Zn, O, and N is preferably greater than or equal to 0.90, more preferably greater than or equal to 0.97. In other words, the total atomic proportion of elements other than Ga, Al, Zn, O, and N is preferably less than or equal to 0.10, more preferably less than or equal to 0.03. By using such a film having the above composition as the protective film of the organic optical device, entry of hydrogen, moisture, an impurity, or the like into an organic compound or a metal material from the outside of the organic optical device can be suppressed.

Examples of a material of the insulating film containing Ga or Al, Zn, and O include a Ga—Zn—O-based material, an Al—Zn—O-based material, a Ga—Zn—O—N-based material, an Al—Zn—O—N-based material, a Ga—Al—Zn—O-based material, and a Ga—Al—Zn—O—N-based material. Note that for example, a Ga—Zn—O-based material means a material containing gallium, zinc, and oxygen as its main components.

The insulating film containing Ga or Al, Zn, and O is formed in such a manner that, for example, a Ga—Zn—O-based metal oxide target ($Ga_2O_3$:ZnO=1:5 to 5:1 [molar ratio]) or an Al—Zn—O-based metal oxide target ($Al_2O_3$:ZnO=1:5 to 5:1 [molar ratio]) is used and deposition is performed in an oxygen atmosphere or a mixed atmosphere of argon and oxygen (an example of the flow ratio is argon:oxygen=7:3). In addition, the insulating film containing Ga or Al, Zn, O, and N is formed in such a manner that the above target is used and deposition is performed in a mixed atmosphere of argon, oxygen, and nitrogen (an example of the flow ratio is argon:oxygen:nitrogen=3:6:1).

The specific resistance of the insulating film included in the functional layer 201 is preferably higher than or equal to $10^{10}$ Ωcm at 20° C., in which case the functional layer 201 can have a sufficient insulating property.

Note that the functional layer 201 may include a single layer or plural layers. In addition, the functional layer 201 may include a layer other than the insulating film containing Ga or Al, Zn, and O.

<Supporting Body>

For the supporting body 101, glass, quartz, plastics, or the like can be used, for example. A flexible substrate may also be used. The flexible substrate is a substrate that can be bent (is flexible), such as a plastic substrate made of polycarbonate, polyarylate, or polyether sulfone, for example. In addition, a film (made of polypropylene, polyester, vinyl, polyvinyl fluoride, polyvinyl chloride, or the like), an inorganic vapor deposition film, or the like can be used.

<Light-Emitting Body>

The light-emitting body 301 contains an organic compound. For the light-emitting body 301, a light-emitting element such as a light-emitting diode (LED), an organic EL element, or an inorganic EL element can be used. As an organic compound contained in the light-emitting body 301, an organic compound contained in the organic EL element, an organic transistor, or the like can be given. Besides, the light-emitting body 301 may include a transistor which is formed using silicon or an oxide semiconductor.

Figure 1B:
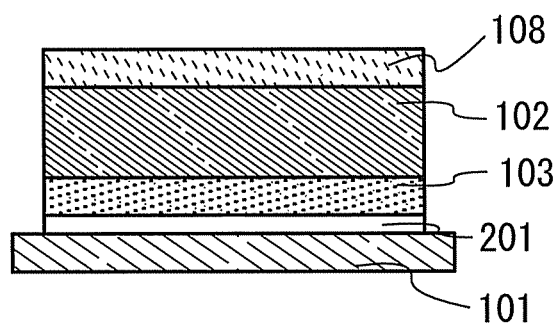

FIG. 1B illustrates an organic optical device (an organic EL element) including an EL layer 102 as a light-emitting body.

The organic optical device illustrated in FIG. 1B includes a supporting body 101, a functional layer 201, a first electrode 103, the EL layer 102, and a second electrode 108. Specifically, the functional layer 201 is provided over the supporting body 101, the first electrode 103 is provided over the functional layer 201, the EL layer 102 is provided over the first electrode 103, and the second electrode 108 is provided over the EL layer 102.

The supporting body 101 and the functional layer 201 can have structures similar to those in the organic optical device illustrated in FIG. 1A.

<EL Layer>

The EL layer 102 includes at least a layer containing a light-emitting organic compound. The EL layer 102 can have a stacked structure in which the layer containing a light-emitting organic compound is combined with a layer containing a substance having a high electron-transport property, a layer containing a substance having a high hole-transport property, a layer containing a substance having a high electron-injection property, a layer containing a substance having a high hole-injection property, a layer containing a bipolar substance (a substance having a high electron-transport property and a high hole-transport property), and the like as appropriate. An example of the structure of the EL layer 102 will be described in detail in Embodiment 4.

<First Electrode>

Like the supporting body 101 and the functional layer 201, the first electrode 103 is provided on the side where light from the EL layer 102 is extracted. The first electrode 103 has a property of transmitting light with a wavelength of greater than or equal to 450 nm and less than or equal to 650 nm, preferably greater than or equal to 400 nm and less than or equal to 700 nm.

As a light-transmitting material for the first electrode 103, indium oxide, indium tin oxide (ITO), indium zinc oxide, zinc oxide, zinc oxide to which gallium is added, graphene, or the like can be used.

In addition, as the first electrode 103, a metal material such as gold, platinum, nickel, tungsten, chromium, molybdenum, iron, cobalt, copper, palladium, or titanium can also be used. Further, a nitride of the metal material (such as titanium nitride) or the like may be used. In the case of using the metal material (or the nitride thereof), the first electrode 103 may be thinned so as to be able to transmit light.

<Second Electrode>

The second electrode 108 is provided on the side opposite to the light extraction side and is formed using a reflective material. As the reflective material, a metal material such as aluminum, gold, platinum, silver, nickel, tungsten, chromium, molybdenum, iron, cobalt, copper, or palladium can be used. In addition, an alloy containing aluminum (an aluminum alloy) such as an alloy of aluminum and titanium, an alloy of aluminum and nickel, or an alloy of aluminum and neodymium, or an alloy containing silver such as an alloy of silver and copper can be used. An alloy of silver and copper is preferable because of its high heat resistance. Further, by stacking a metal film or a metal oxide film on and in contact with an aluminum alloy film, oxidation of the aluminum alloy film can be prevented. Examples of a material for the metal film or the metal oxide film include titanium, titanium oxide, and the like.

Figure 1C:
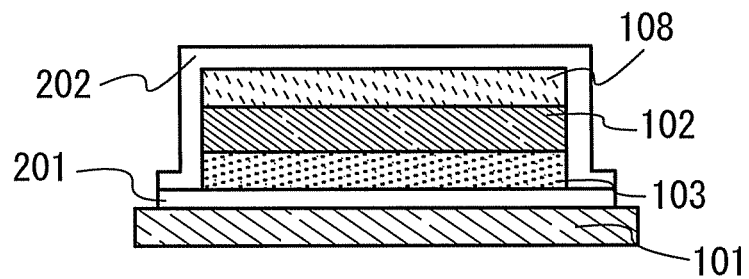

FIG. 1C illustrates another example of the organic optical device which includes the EL layer 102 as the light-emitting body.

The organic optical device illustrated in FIG. 1C includes a supporting body 101, a functional layer 201, a first electrode 103, an EL layer 102, a second electrode 108, and a sealing film 202. Specifically, the functional layer 201 is provided over the supporting body 101, the first electrode 103 is provided over the functional layer 201, the EL layer 102 is provided over the first electrode 103, the second electrode 108 is provided over the EL layer 102, and the sealing film 202 covering the second electrode 108 is provided.

The supporting body 101, the functional layer 201, the first electrode 103, the EL layer 102, and the second electrode 108 can have structures similar to those in the organic optical devices illustrated in FIGS. 1A and 1B.

<Sealing Film>

The sealing film 202 includes an insulating film containing Ga or Al, Zn, and O. The insulating film containing Ga or Al, Zn, and O can have a structure similar to that of the insulating film containing Ga or Al, Zn, and O which can be used for the functional layer 201. The sealing film 202 may include a single layer or plural layers.

In the organic optical device illustrated in FIG. 1C, the sealing film 202 covers the second electrode 108. Further, the functional layer 201 and the sealing film 202 are in contact with each other. In FIG. 1C, the first electrode 103, the EL layer 102, and the second electrode 108 are surrounded by the functional layer 201 and the sealing film 202.

By providing the insulating films each containing Ga or Al, Zn, and O so as to surround the first electrode 103, the EL layer 102, and the second electrode 108, entry of moisture or an impurity into an organic compound contained in the EL layer 102 or a metal material contained in the electrode can be suppressed.

In the organic optical device described in this embodiment, the insulating film containing Ga or Al, Zn, and O is provided as the protective film, so that entry of hydrogen, moisture, an impurity, or the like into an organic compound or a metal material from the outside of the organic optical device can be suppressed. The insulating film containing Ga or Al, Zn, and O has a property of transmitting visible light. Therefore, the insulating film does not hinder light extraction even when provided on the side where light emission of the organic optical device is extracted, and therefore is preferable.

As described above, by employing an embodiment of the present invention, it is possible to provide an organic optical device which can suppress deterioration due to moisture or an impurity.

(Embodiment 2)

A protective component according to an embodiment of the present invention and an organic optical device to which the protective component is applied will be described with reference to FIGS. 2A to 2D and FIGS. 5A and 5B. The protective component according to an embodiment of the present invention can be applied to an organic optical device. The protective component can also be applied to the organic optical device described in Embodiment 1.

The protective component according to an embodiment of the present invention has a property of transmitting visible light and includes at least three layers. The protective component according to an embodiment of the present invention may have a property of transmitting light with a wavelength of greater than or equal to 450 nm and less than or equal to 650 nm, preferably greater than or equal to 400 nm and less than or equal to 700 nm.

Figure 2A:
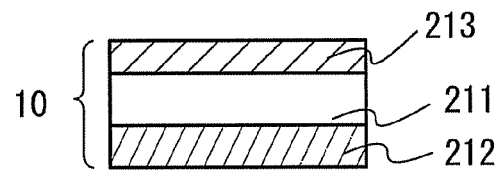
FIGS. 2A to 2D illustrate a protective component and an organic optical device according to an embodiment of the present invention.

A protective component 10 illustrated in FIG. 2A includes a functional layer 211, a first film 212 in contact with one surface of the functional layer 211, and a second film 213 in contact with the other surface of the functional layer 211. That is, the functional layer 211 is provided over the first film 212, and the second film 213 is provided over the functional layer 211.

<Functional Layer>

The functional layer 211 includes an insulating film containing gallium (Ga) or aluminum (Al), zinc (Zn), and oxygen (O). By using the insulating film as a protective film of the organic optical device, entry of hydrogen, moisture, an impurity, or the like into an organic compound or a metal material from the outside of the organic optical device can be suppressed.

The insulating film containing Ga or Al, Zn, and O may also contain nitrogen (N). By forming the insulating film by combining these elements, the refractive index of the insulating film can have a desired value while the property of transmitting visible light is kept.

In the insulating film containing Ga or Al, Zn, and O, the total atomic proportion of Ga, Al, Zn, O, and N is preferably greater than or equal to 0.90, more preferably greater than or equal to 0.97. In other words, the total atomic proportion of elements other than Ga, Al, Zn, O, and N is preferably less than or equal to 0.10, more preferably less than or equal to 0.03. By using such a film having the above composition as the protective film of the organic optical device, entry of moisture or an impurity into an organic compound or a metal material can be suppressed.

Examples of a material of the insulating film containing Ga or Al, Zn, and O include a Ga—Zn—O-based material, an Al—Zn—O-based material, a Ga—Zn—O—N-based material, an Al—Zn—O—N-based material, a Ga—Al—Zn—O-based material, and a Ga—Al—Zn—O—N-based material.

The insulating film containing Ga or Al, Zn, and O is formed in such a manner that for example, a Ga—Zn—O-based metal oxide target ($Ga_2O_3$:ZnO=1:5 to 5:1 [molar ratio]) is used and deposition is performed.

The specific resistance of the insulating film included in the functional layer 211 is preferably higher than or equal to $10^{10}$ Ωcm at 20° C., in which case the functional layer 211 can have a sufficient insulating property.

Note that the functional layer 211 may include a single layer or plural layers. In addition, the functional layer 211 may include a layer other than the insulating film containing Ga or Al, Zn, and O.

In an organic optical device, when light enters, from a light-emitting body, a medium whose refractive index is different from that of the light-emitting body, part of the light is reflected. The larger a difference in refractive index between two media is, the more likely light is to be reflected, which results in reduction in light extraction efficiency of the organic optical device.

In an embodiment of the present invention, the refractive index of the functional layer is set such that reflection of light due to a difference in refractive index between two media can be reduced.

Specifically, a difference in refractive index between a layer included in the functional layer 211 and a layer in contact with the layer included in the functional layer 211 is less than or equal to 0.2. When the above difference is less than or equal to 0.15, reflection of light due to the difference in refractive index can be reduced to less than or equal to 1%, which is preferable. The smaller the difference in refractive index is, the more reflection of light due to the difference in refractive index can be reduced.

In the protective component having the above structure, since a difference in refractive index between a layer in contact with the first film 212 (a layer included in the functional layer 211) and the first film 212 and a difference in refractive index between a layer in contact with the second film 213 (a layer included in the functional layer 211) and the second film 213 are each small, reflection of light due to the difference in refractive index can be reduced.

When the refractive indexes of the layers included in the protective component (the layer included in the functional layer, the first film, and the second film) are lower than the refractive index of the light-emitting body, total reflection is caused inside the protective component under a certain condition.

Therefore, it is preferable that the refractive indexes of the layers included in the protective component (the layer included in the functional layer, the first film, and the second film) be higher than or equal to the refractive index of the light-emitting body. With such a structure, total reflection of light inside the protective component can be reduced.

The protective component described in this embodiment includes the insulating film containing Ga or Al, Zn, and O, so that entry of hydrogen, moisture, an impurity, or the like into an organic compound or a metal material from the outside of the organic optical device can be suppressed. The insulating film containing Ga or Al, Zn, and O has a property of transmitting visible light. Therefore, the insulating film does not hinder light extraction even when provided on the side where light emission of the organic optical device is extracted, and therefore is preferable.

In addition, since the difference in refractive index between a layer included in the protective component in accordance with this embodiment and a layer in contact with the layer included in the protective component is less than or equal to 0.2, reflection of light due to the difference in refractive index in the organic optical device can be reduced.

As described above, by employing the protective component according to an embodiment of the present invention, it is possible to provide an organic optical device which can suppress deterioration due to moisture or an impurity. In addition, it is possible to provide an organic optical device having high light extraction efficiency.

An organic optical device using the protective component 10 illustrated in FIG. 2A will be described with reference to FIGS. 2B to 2D.

Figure 2B:
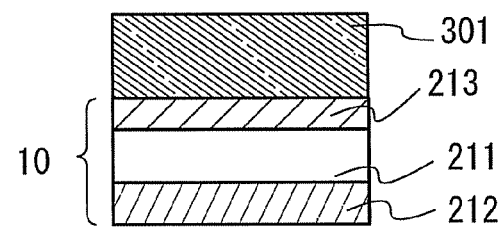

An organic optical device illustrated in FIG. 2B includes the protective component 10 on the side where light from a light-emitting body 301 is extracted. Specifically, the functional layer 211 is provided over the first film 212, the second film 213 is provided over the functional layer 211, and the light-emitting body 301 is provided over the second film 213.

<Light-Emitting Body>

The light-emitting body 301 contains an organic compound. Note that for the light-emitting body 301, a structure and a material similar to those in Embodiment 1 can be used.

In the organic optical device illustrated in FIG. 2B, the insulating film containing Ga or Al, Zn, and O is provided as the functional layer 211, so that entry of hydrogen, moisture, an impurity, or the like into an organic compound or a metal material from the outside of the organic optical device can be suppressed.

In addition, since the difference in refractive index between a layer included in the protective component 10 and a layer in contact with the layer included in the protective component 10 is less than or equal to 0.2, reflection of light due to the difference in refractive index can be reduced.

Figure 2C:
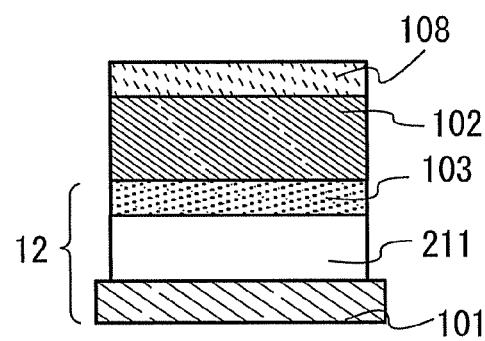
Figure 2D:
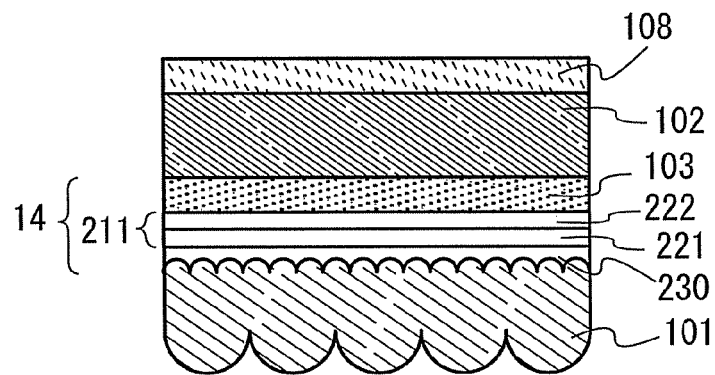

FIGS. 2C and 2D each illustrate an example of the organic optical device which includes an EL layer 102 as a light-emitting body.

Organic optical devices illustrated in FIGS. 2C and 2D each include a supporting body 101, a functional layer 211, a first electrode 103, the EL layer 102, and a second electrode 108.

In the organic optical device illustrated in FIG. 2C, the functional layer 211 is provided over the supporting body 101, the first electrode 103 is provided over the functional layer 211, the EL layer 102 is provided over the first electrode 103, and the second electrode 108 is provided over the EL layer 102. The organic optical device illustrated in FIG. 2C includes a protective component 12. The supporting body 101 corresponds to a first film in the protective component 12 and the first electrode 103 corresponds to a second film in the protective component 12.

In the organic optical device illustrated in FIG. 2D, a planarization film 230 is provided over the supporting body 101, the functional layer 211 is provided over the planarization film 230, the first electrode 103 is provided over the functional layer 211, the EL layer 102 is provided over the first electrode 103, and the second electrode 108 is provided over the EL layer 102. The organic optical device illustrated in FIG. 2D includes a protective component 14. The planarization film 230 corresponds to a first film in the protective component 14 and the first electrode 103 corresponds to a second film in the protective component 14.

In FIGS. 2C and 2D, the first electrode 103, the EL layer 102, and the second electrode 108 can have structures similar to those in Embodiment 1.

<Protective Component>

Now, the refractive index of each of the layers included in the protective component according to an embodiment of the present invention will be described.

SPECIFIC EXAMPLE 1

Specific Example 1 is described with the use of the protective component 12 illustrated in FIG. 2C. In the protective component 12 illustrated in FIG. 2C, the functional layer 211 includes a single layer.

In Specific Example 1, a glass substrate having a refractive index of 1.6 is used as the supporting body 101 and ITO having a refractive index of 2.0 is used as the first electrode 103.

As described above, a difference in refractive index between a layer included in the functional layer 211 and a layer in contact with the layer included in the functional layer 211 is less than or equal to 0.2.

Since the functional layer 211 is in contact with the supporting body 101 having a refractive index of 1.6, the refractive index of the functional layer 211 needs to be higher than or equal to 1.4 and lower than or equal to 1.8. In addition, since the functional layer 211 is in contact with the first electrode 103 having a refractive index of 2.0, the refractive index of the functional layer 211 needs to be higher than or equal to 1.8 and lower than or equal to 2.2. Therefore, a layer having a refractive index of 1.8 is used as the functional layer 211. In this embodiment, a layer which is formed of a Ga—Zn—O-based material and has a refractive index of 1.8 is used.

With such a structure, the difference in refractive index between the functional layer 211 and each of the layers (the first electrode 103 and the supporting body 101) in contact with the functional layer 211 can be less than or equal to 0.2, whereby reflection of light due to the difference in refractive index in the organic optical device can be reduced.

The functional layer 211 includes the insulating film containing Ga, Zn, and O, so that entry of hydrogen, moisture, an impurity, or the like into an organic compound or a metal material from the outside can be suppressed.

Note that an uneven structure is preferably provided at the interface between the air and the supporting body 101. The refractive index of the supporting body 101 is higher than the refractive index of the air. Therefore, when an uneven structure is provided at the interface between the air and the supporting body 101, light which cannot be extracted to the air owing to total reflection can be reduced, and the light extraction efficiency of the organic optical device can be improved. A specific example of the supporting body 101 having the uneven structure is described in Embodiment 3.

SPECIFIC EXAMPLE 2

Specific Example 2 is described with the use of the protective component 14 illustrated in FIG. 2D. In the protective component 14 illustrated in FIG. 2D, the functional layer 211 includes two layers.

In Specific Example 2, ITO having a refractive index of 2.0 is used for the first electrode 103 and a resin having a refractive index of 1.6 is used for the planarization film 230. In addition, the supporting body 101 is formed in such a manner that micro lens arrays each having a refractive index of 1.5 are provided on upper and lower surfaces of a glass substrate having a refractive index of 1.5.

As described above, the difference in refractive index between a layer included in the functional layer 211 and a layer in contact with the layer included in the functional layer 211 is less than or equal to 0.2. Therefore, the refractive index of a first functional layer 221 in the functional layer 211, which is in contact with the planarization film 230, is higher than or equal to 1.4 and lower than or equal to 1.8. In this embodiment, a layer which is formed of a Ga—Zn—O-based material and has a refractive index of 1.7 is used as the first functional layer 221.

In addition, the refractive index of a second functional layer 222 which is in contact with the first electrode 103 and the first functional layer 221 is higher than or equal to 1.8 and lower than or equal to 1.9. In this embodiment, a layer which is formed of a Ga—Zn—O-based material and has a refractive index of 1.9 is used as the second functional layer 222.

With such a structure, the difference in refractive index between a layer included in the functional layer 211 and a layer in contact with the layer included in the functional layer 211 can be less than or equal to 0.2, whereby reflection of light due to the difference in refractive index in the organic optical device can be reduced.

In addition, the functional layer 211 includes the insulating film containing Ga, Zn, and O, so that entry of hydrogen, moisture, an impurity, or the like into an organic compound or a metal material from the outside of the organic optical device can be suppressed.

<Planarization Film>

In general, the EL layer 102 (corresponding to the light-emitting body) which includes a layer containing a light-emitting organic compound has a refractive index of higher than or equal to 1.6. As described above, in the case where the refractive index of a medium A is higher than the refractive index of a medium B and the refractive index of the medium B is lower than the refractive index of a light-emitting body (or a layer containing a light-emitting organic compound), when light enters the medium B from the medium A, total reflection of light is caused in some cases.

In FIG. 2D, when light enters the supporting body 101 having a refractive index of 1.5 from the planarization film 230 having a refractive index of 1.6, total reflection of light is caused under a certain condition.

Therefore, in Specific Example 2, the uneven structure is formed on the surface of the supporting body 101, which is in contact with the planarization film 230, with the use of the micro lens array. With the uneven structure at the interface between the planarization film 230 and the supporting body 101, a phenomenon can be suppressed, in which light entering the supporting body 101 from the planarization film 230 at an incidence angle exceeding a critical angle is totally reflected and the wave of the light propagates inside the device to lower the light extraction efficiency.

As illustrated in FIG. 2D, the planarization film 230 is more flat on the side in contact with the first functional layer 221 than on the side in contact with the supporting body 101. Therefore, the first functional layer 221 and the first electrode 103 can be flat. As a result, leakage current in the EL layer 102 due to unevenness of the first electrode 103 can be suppressed.

As a material of the planarization film 230, a liquid, a resin, or the like having a high refractive index can be used. The planarization film 230 has a light-transmitting property. Examples of a resin having a high refractive index include a resin containing bromine, a resin containing sulfur, and the like. For example, a sulfur-containing polyimide resin, an episulfide resin, a thiourethane resin, a brominated aromatic resin, or the like can be used. In addition, polyethylene terephthalate (PET), triacetyl cellulose (TAC), or the like can be used. As a liquid having a high refractive index, a contact liquid (refractive liquid) containing sulfur and methylene iodide, or the like can be used. Any of a variety of methods suitable for the material may be employed for forming the planarization film 230. For example, any of the above resins is deposited by a spin coating method and cured by heat or light, so that the planarization film 230 can be formed. The material and the method can be selected as appropriate in consideration of the adhesion strength, ease of processing, or the like.

In this embodiment, the insulating film containing Ga, Zn, and O is provided between the planarization film 230 and the EL layer 102, so that entry of hydrogen, moisture, an impurity, or the like into an organic compound or a metal material from the outside of the organic optical device can be suppressed.

In this embodiment, an example in which the functional layer 211 includes a single layer or two layers is described, but the present invention is not limited thereto, and the functional layer 211 may include three or more layers.

Figure 5A:
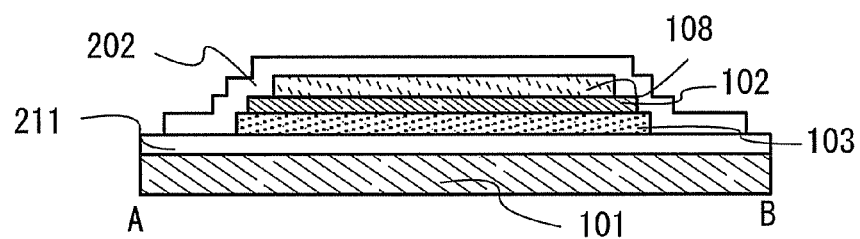
FIGS. 5A and 5B illustrate an organic optical device according to an embodiment of the present invention.
Figure 5B:
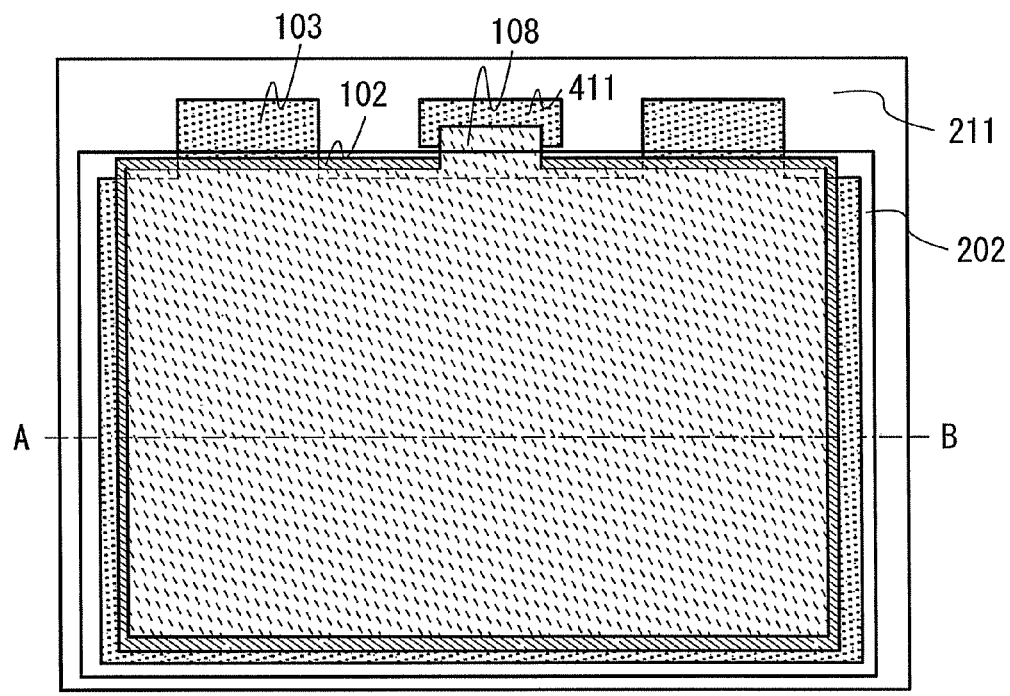

FIGS. 5A and 5B illustrate another example of an organic optical device in which an organic EL phenomenon is utilized. FIG. 5A is a cross-sectional view along A-B in FIG. 5B.

The organic optical device illustrated in FIGS. 5A and 5B includes a supporting body 101, a functional layer 211, a first electrode 103, an EL layer 102, a second electrode 108, and a sealing film 202. Specifically, the functional layer 211 is provided over the supporting body 101, the first electrode 103 is provided over the functional layer 211, the EL layer 102 is provided over the first electrode 103, the second electrode 108 is provided over the EL layer 102, and the sealing film 202 covering the second electrode 108 is provided. In addition, a conductive layer 411 which is formed using the same material as the first electrode 103 serves as a connection terminal.

In the organic optical device illustrated in FIGS. 5A and 5B, the supporting body 101 corresponds to a first film in a protective component and the first electrode 103 corresponds to a second film in the protective component.

The functional layer 211 can have a structure similar to that of the organic optical device illustrated in FIG. 2C.

The sealing film 202, the supporting body 101, the first electrode 103, the EL layer 102, and the second electrode 108 can have structures similar to those in Embodiment 1.

The functional layer 211 includes an insulating film containing Ga or Al, Zn, and O. In addition, the sealing film 202 includes an insulating film containing Ga or Al, Zn, and O.

In the organic optical device illustrated in FIG. 5A, the sealing film 202 covers the second electrode 108. Further, the functional layer 211 and the sealing film 202 are in contact with each other. In FIG. 5A, the first electrode 103, the EL layer 102, and the second electrode 108 are surrounded by the functional layer 211 and the sealing film 202.

It is particularly preferable that the insulating film containing Ga or Al, Zn, and O included in the functional layer 211 and the sealing film 202 be in contact with each other. By providing the insulating films each containing Ga or Al, Zn, and O so as to surround the first electrode 103, the EL layer 102, and the second electrode 108, entry of moisture, an impurity, or the like into an organic compound contained in the EL layer 102 or a metal material contained in the electrode can be suppressed.

The organic optical device described in this embodiment includes the insulating film containing Ga or Al, Zn, and O as one layer of the protective component, so that entry of moisture or an impurity into an organic compound or a metal material can be suppressed. The insulating film containing Ga or Al, Zn, and O has a property of transmitting visible light. Therefore, the insulating film does not hinder light extraction even when provided on the side where light emission of the organic optical device is extracted, and therefore is preferable.

In addition, in the organic optical device described in this embodiment, since a difference in refractive index between a layer included in the protective component and a layer in contact with the layer included in the protective component is less than or equal to 0.2, reflection of light due to the difference in refractive index can be reduced.

In an embodiment of the present invention, by setting the refractive index of the protective component to be higher than or equal to that of the light-emitting body, total reflection of light inside the protective component can be reduced. Further, in the case where the refractive index of the protective component is higher than or equal to that of the light-emitting body and the refractive index of the supporting body is lower than that of the light-emitting body and light enters the supporting body from the protective component, the planarization film having a refractive index of higher than or equal to that of the light-emitting body is provided between the functional layer and the supporting body. In addition, an uneven structure is provided at the interface between the planarization film and the supporting body. With such a structure, in the organic optical device, a phenomenon can be suppressed, in which light is totally reflected and the wave of the light propagates inside the device to lower the light extraction efficiency. Moreover, the first electrode can be prevented from being uneven, so that generation of leakage current in the EL layer can be suppressed.

As described above, by employing an embodiment of the present invention, it is possible to provide an organic optical device which can suppress deterioration due to moisture or an impurity. In addition, it is possible to provide an organic optical device having high light extraction efficiency.

This embodiment can be freely combined with any of other embodiments.

(Embodiment 3)

In this embodiment, a supporting body provided with uneven structures on upper and lower surfaces, which can be applied to an embodiment of the present invention, will be described with reference to FIGS. 3A to 3F.

By independently providing the uneven structures on the upper and lower surfaces of the supporting body, it is possible to provide an organic optical device having high light extraction efficiency. Although an uneven structure in a stripe shape is effective, an uneven structure in a matrix is more preferable.

FIGS. 3A to 3F each illustrate an example of a supporting body 101 provided below an organic optical device according to an embodiment of the present invention.

Each of the supporting bodies 101 illustrated in FIGS. 3A to 3F has a pattern of an uneven structure on each of the upper and lower surfaces thereof. The pattern of the uneven structure of the supporting body 101 is not particularly limited.

Figure 3A:
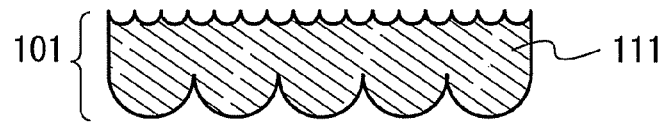
FIGS. 3A to 3F illustrate examples of a supporting body according to an embodiment of the present invention.
Figure 3B:
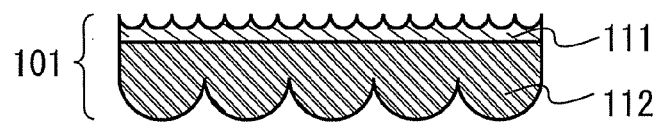
Figure 3C:
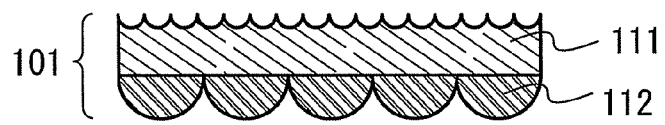
Figure 3D:
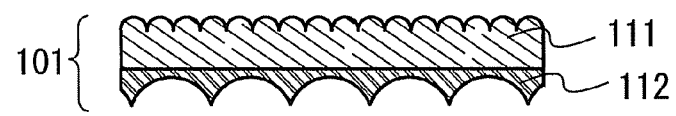
Figure 3E:
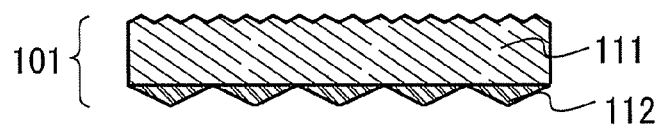

The pattern of the uneven structure can be, for example, in a hemispherical shape (FIGS. 3A to 3D and 3F), or a shape with an apex such as a circular cone or a pyramid (e.g., a triangular pyramid or a quadrangular pyramid) (FIG. 3E).

The size or height of a projection included in the uneven structure of the supporting body 101 is preferably about greater than or equal to 0.1 μm and less than or equal to 1000 μm. In particular, the projection included in the uneven structure preferably has a size or height of greater than or equal to 1 μm, in which case influence of interference of light can be suppressed.

It is preferable that patterns be provided so that a space is not formed between adjacent patterns.

The supporting body 101 may be formed using one kind of material as illustrated in FIG. 3A or a stack of a plurality of materials as illustrated in FIGS. 3B to 3F. In the case where the supporting body 101 includes a plurality of layers, the plurality of layers may have different refractive indexes.

In the case where the supporting body 101 includes a plurality of layers having different refractive indexes, in all the layers, a difference in refractive index between a layer included in the supporting body 101 and a layer in contact with the layer included in the supporting body 101 is preferably less than or equal to 0.2, in which case reflection of light due to the difference in refractive index can be reduced. The difference in refractive index between a layer included in the supporting body and a layer in contact with the layer included in the supporting body is more preferably less than or equal to 0.15 in all the layers, in which case reflection of light due to the difference in refractive index can be reduced to less than or equal to 1%. The smaller the difference in refractive index between the layers included in the supporting body 101 is, the more reflection of light due to the difference in refractive index can be reduced.

In the case where the supporting body includes a plurality of layers having different refractive indexes, when the refractive index of one of two adjacent layers on the side closer to the light-emitting body is higher than that of a layer on the other side, an uneven structure is preferably provided at the interface between the two layers.

Further, the case where the refractive index of one of the two adjacent layers included in the supporting body 101 on the side closer to the light-emitting body is lower than or equal to that of the layer on the other side is convenient because a step of providing an uneven structure is not needed.

The supporting body 101 illustrated in FIG. 3A includes only a first material layer 111.

Examples of a material that can be used for the first material layer 111 include glass, a resin, and the like. As the resin, a polyester resin, a polyacrylonitrile resin, a polyimide resin, a polymethyl methacrylate resin, a polycarbonate resin, a polyethersulfone resin, a polyamide resin, a cycloolefin resin, a polystyrene resin, a polyamide imide resin, a polyvinylchloride resin, or the like can be used.

As a method for forming an uneven structure using the above material, for example, an etching method, a sand blasting method, a microblast processing method, a droplet discharge method, a printing method (e.g., screen printing or offset printing by which a pattern is formed), a coating method such as a spin coating method, a dipping method, a dispenser method, an imprint method, a nanoimprint method, or the like can be employed as appropriate.

The supporting bodies 101 illustrated in FIGS. 3B to 3E each include the first material layer 111 and a second material layer 112. The first material layer 111 has an uneven structure on the side opposite to the side in contact with the second material layer 112. The second material layer 112 has an uneven structure on the side opposite to the side in contact with the first material layer 111.

The first material layer 111 in each of the supporting bodies 101 illustrated in FIGS. 3C to 3E can be formed using any of the above materials and methods. Further, the second material layer 112 can be formed using a hemispherical lens, a micro lens array, a film provided with an uneven structure, a light diffusing film, or the like, in addition to the materials and methods that can be used for the first material layer 111. For example, the above lens or film is attached to the first material layer 111 with the use of an adhesive or the like whose refractive index is substantially the same as that of the first material layer 111 or the second material layer 112, so that the second material layer 112 can be formed.

The first material layer 111 in the supporting body 101 illustrated in FIG. 3B can be Banned using a material and a method that are similar to those of the second material layers 112 illustrated in FIGS. 3C to 3E. The second material layer 112 can be formed using a material and a method that are similar to those of the first material layers 111 illustrated in FIGS. 3C to 3E.

In the case where the supporting body includes two layers as in the case of the supporting bodies 101 illustrated in FIGS. 3B to 3E, a difference in refractive index between the first material layer 111 and the second material layer 112 is preferably less than or equal to 0.2, more preferably less than or equal to 0.15. The smaller the difference in refractive index between the layers included in the supporting body 101 is, more reflection of light due to the difference in refractive index can be reduced. Further, the refractive index of the first material layer 111 is preferably lower than that of the second material layer 112, in which case loss of light due to total reflection at the interface between the first material layer 111 and the second material layer 112, or the like can be reduced and the light extraction efficiency can be increased.

Figure 3F:
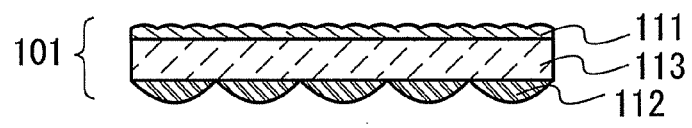

The supporting body 101 illustrated in FIG. 3F includes the first material layer 111, the second material layer 112, and a third material layer 113. The first material layer 111 has an uneven structure on the side opposite to the side in contact with the third material layer 113. The second material layer 112 has an uneven structure on the side opposite to the side in contact with the third material layer 113. Each of the first material layer 111 and the second material layer 112 can be formed using a material and a method that are similar to those in FIGS. 3C to 3E.

In the supporting body 101 illustrated in FIG. 3F, at least the third material layer 113 may have a function as a supporting body. Therefore, the first material layer 111 and the second material layer 112 may be formed to be thin and can be formed using a material having optical characteristics that are necessary, which is selected as appropriate. The first material layer 111 and the second material layer 112 may each be formed to a thickness of about several tens of micrometers, and may be formed to a thickness of greater than or equal to several tens of micrometers if needed.

The third material layer 113 can be formed without a process of forming unevenness, and thus can be formed using an inexpensive material or a readily available material as appropriate selected from the above glass or resins without considering the processability or the like. For example, a resin is preferable because of ease of reuse as well as light weight and resistance to breakage.

In the case where the supporting body includes three layers as in the case of the supporting body 101 illustrated in FIG. 3F, a difference in refractive index between the three layers is preferably less than or equal to 0.2, more preferably less than or equal to 0.15. The smaller the difference in refractive index between the three layers is, the more reflection of light due to the difference in refractive index can be reduced.

Further, it is preferable that the refractive index of the first material layer 111 be the lowest, the refractive index of the third material layer 113 be higher than or equal to that of the first material layer 111, and the refractive index of the second material layer 112 be higher than or equal to that of the third material layer 113 for the following reason: loss of light due to total reflection at the interface between the first material layer 111 and the third material layer 113 and the interface between the second material layer 112 and the third material layer 113, or the like can be reduced, which results in increase in light extraction efficiency.

Note that the timing of formation of the uneven structure at the interface between the supporting body 101 and the air is not limited, and the uneven structure may be formed before the functional layer or the light-emitting body is provided over the supporting body 101 or after the functional layer or the light-emitting body is provided over the supporting body 101. It is preferable that the uneven structure be formed at the interface with the air after the layer included in the organic optical device is formed (or after the light-emitting body or the like is sealed), in which case the uneven structure can be prevented from being broken during a formation process of the functional layer, the light-emitting body, or the like or during transfer.

Since the uneven structure is provided at the interface between the air and the supporting body in accordance with this embodiment, even when total reflection is caused at the interface between the supporting body and the air, light in the substrate mode, whose wave propagates inside the supporting body, can be easily extracted to the outside. Thus, the light extraction efficiency can be increased.

Further, in this embodiment, since the uneven structure is provided at another interface of the supporting body, which is opposite to the interface between the air and the supporting body, even when total reflection is caused at the interface opposite to the interface with the air, light in the waveguide mode, whose wave propagates inside the light-emitting body, can be easily extracted to the outside. Thus, the light extraction efficiency can be increased.

This embodiment can be freely combined with any of other embodiments.

(Embodiment 4)

In this embodiment, an example of an EL layer which can be applied to an embodiment of the present invention will be described with reference to FIGS. 4A to 4C.

Figure 4A:
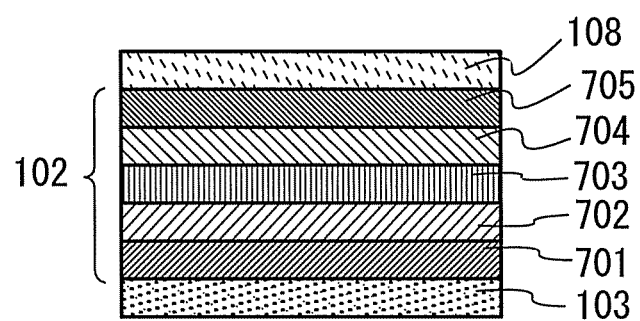
FIGS. 4A to 4C illustrate examples of an EL layer according to an embodiment of the present invention.

As illustrated in FIG. 4A, an EL layer 102 is provided between a first electrode 103 and a second electrode 108. Note that the first electrode 103 and the second electrode 108 can have structures similar to those in Embodiment 1.

In this embodiment, in the EL layer 102, a hole-injection layer 701, a hole-transport layer 702, a layer 703 containing a light-emitting organic compound, an electron-transport layer 704, and an electron-injection layer 705 are stacked in this order from the first electrode 103 side.

Next, a method for manufacturing a light-emitting element illustrated in FIG. 4A is described.

The hole-injection layer 701 is a layer containing a substance having a high hole-injection property. As the substance having a high hole-injection property, for example, a metal oxide such as molybdenum oxide, titanium oxide, vanadium oxide, rhenium oxide, ruthenium oxide, chromium oxide, zirconium oxide, hafnium oxide, tantalum oxide, silver oxide, tungsten oxide, or manganese oxide can be used. In addition, a phthalocyanine-based compound such as phthalocyanine (abbreviation: $H_2Pc$), or copper(II) phthalocyanine (abbreviation: CuPc) can be used.

In addition, any of the following aromatic amine compounds which are low molecular organic compounds and the like can be used: 4,4',4"-tris(N,N-diphenylamino)triphenyl amine (abbreviation: TDATA), 4,4',4"-tris[N-(3-methylphenyl)-N-phenylamino]triphenylamine (abbreviation: MTDATA), 4,4'-bis[N-(4-diphenylaminophenyl)-N-phenylamino]biphenyl (abbreviation: DPAB), 4,4'-bis(N-{4-[N'-(3-methylphenyl)-N'-phenylamino]phenyl}-N-phenylamino)biphenyl (abbreviation: DNTPD), 1,3,5-tris[N-(4-diphenylaminophenyl)-N-phenylamino]benzene (abbreviation: DPA3B), 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), and 3-[N-(1-naphthyl)-N-(9-phenylcarbazol-3-yl)amino]-9-phenylcarbazole (abbreviation: PCzPCN1).

Further, a high molecular compound (e.g., an oligomer, a dendrimer, or a polymer) can be used. For example, a high molecular compound such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl)methacrylamide](abbreviation: PTPDMA), or poly[N,N'-bis(4-butylphenyl)-N,N'-bis(phenyl)benzidine (abbreviation: poly-TPD) can be used. In addition, a high molecular compound to which acid is added, such as poly(3,4-ethylenedioxythiophene)/poly(styrenesulfonic acid) (PEDOT/PSS), or polyaniline/poly(styrenesulfonic acid) (PAni/PSS), can be used.

In particular, for the hole-injection layer 701, a composite material in which an acceptor substance is added to an organic compound having a high hole-transport property is preferably used. With the use of the composite material in which an acceptor substance is added to a substance having a high hole-transport property, an excellent hole-injection property from the first electrode 103 can be obtained, which results in reduction in drive voltage of the light-emitting element. Such a composite material can be formed by co-evaporation of a substance having a high hole-transport property and an acceptor substance. When the hole-injection layer 701 is formed using the composite material, holes are easily injected from the first electrode 103 into the EL layer 102.

As the organic compound used for the composite material, any of various compounds such as an aromatic amine compound, a carbazole derivative, aromatic hydrocarbon, and a high molecular compound (e.g., an oligomer, a dendrimer, or a polymer) can be used. The organic compound used for the composite material is preferably an organic compound having a high hole-transport property. Specifically, a substance having a hole mobility of higher than or equal to $10^{-6}$ cm$^2$/Vs is preferably used. However, other substances than the above-described materials may be used as long as the substances have higher hole-transport properties than electron-transport properties. The organic compounds which can be used for the composite material will be specifically given below.

Examples of the organic compound that can be used for the composite material include: aromatic amine compounds such as TDATA, MTDATA, DPAB, DNTPD, DPA3B, PCzPCA1, PCzPCA2, PCzPCN1, 4,4'-bis[N-(1-naphthyl)-N-phenylamino]biphenyl (abbreviation: NPB or α-NPD), N,N'-bis(3-methylphenyl)-N,N'-diphenyl-[1,1'-biphenyl]-4,4'-diamine (abbreviation: TPD), and 4-phenyl-4'-(9-phenylfluoren-9-yl)triphenylamine (abbreviation: BPAFLP); and carbazole derivatives such as 4,4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthryl)phenyl]-9H- carbazole (abbreviation: CzPA), 9-phenyl-3-[4-(10-phenyl-9-anthryl)phenyl]-9H-carbazole (abbreviation: PCzPA), and 1,4-bis[4-(N-carbazolyl)phenyl-2,3,5,6-tetraphenylbenzene.

In addition, it is possible to use any of the following aromatic hydrocarbon compounds: 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 9,10-bis[2-(1-naphthyl)phenyl]-2-tert-butylanthracene, 9,10-bis[2-(1-naphthyl)phenyl]anthracene, 2,3,6,7-tetramethyl-9,10-di(1-naphthyl)anthracene, and the like.

Further, it is possible to use any of the following aromatic hydrocarbon compounds: 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, pentacene, coronene, 4,4'-bis(2,2-diphenylvinyl)biphenyl (abbreviation: DPVBi), 9,10-bis[4-(2,2-diphenylvinyl)phenyl]anthracene (abbreviation: DPVPA), and the like.

Further, as an electron acceptor, organic compounds such as 7,7,8,8-tetracyano-2,3,5,6-tetrafluoroquinodimethane (abbreviation: $F_4$-TCNQ) and orchloranil; and a transition metal oxide can be given. In addition, oxides of metals belonging to Groups 4 to 8 in the periodic table can also be given. Specifically, vanadium oxide, niobium oxide, tantalum oxide, chromium oxide, molybdenum oxide, tungsten oxide, manganese oxide, and rhenium oxide are preferable since their electron-accepting properties are high. Among these, molybdenum oxide is especially preferable since it is stable in the air and its hygroscopic property is low and is easily treated.

The composite material may be formed using the above-described electron acceptor and the above-described high molecular compound such as PVK, PVTPA, PTPDMA, or Poly-TPD and used for the hole-injection layer 701.

The hole-transport layer 702 is a layer containing a substance having a high hole-transport property. As the substance having a high hole-transport property, any of the following aromatic amine compounds can be used, for example: NPB, TPD, BPAFLP, 4,4'-bis[N-(9,9-dimethylfluoren-2-yl)-N-phenylamino]biphenyl (abbreviation: DFLDPBi), and 4,4'-bis[N-(spiro-9,9'-bifluoren-2-yl)-N-phenylamino]biphenyl (abbreviation: BSPB). The substances mentioned here are mainly substances that have a hole mobility of higher than or equal to $10^{-6}$ cm$^2$/V·s. However, other substances than the above-described materials may be used as long as the substances have higher hole-transport properties than electron-transport properties. The layer containing a substance having a high hole-transport property is not limited to a single layer, and two or more layers containing the aforementioned substances may be stacked.

For the hole-transport layer 702, a carbazole derivative such as CBP, CzPA, or PCzPA or an anthracene derivative such as t-BuDNA, DNA, or DPAnth may also be used.

In addition, for the hole-transport layer 702, a high molecular compound such as PVK, PVTPA, PTPDMA, or Poly-TPD can be used.

For the layer 703 containing a light-emitting organic compound, a fluorescent compound which exhibits fluorescence or a phosphorescent compound which exhibits phosphorescence can be used.

As the fluorescent compound that can be used for the layer 703 containing a light-emitting organic compound, a material for blue light emission, a material for green light emission, a material for yellow light emission, and a material for red light emission are given. Examples of the material for blue light emission include: N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(10-phenyl-9-anthryl)-4'-(9-phenyl-9H-carbazol-3-yl)triphenylamine (abbreviation: PCBAPA), and the like. Examples of the material for green light emission include: N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine, (abbreviation: 2DPABPhA), N-[9,10-bis(1,1'-biphenyl-2-yl)]-N-[4-(9H-carbazol-9-yl)phenyl]-N-phenylanthracen-2-amine (abbreviation: 2YGABPhA), N,N,9-triphenylanthracen-9-amine (abbreviation: DPhAPhA), and the like. Further, examples of the material for yellow light emission include: rubrene, 5,12-bis(1,1'-biphenyl-4-yl)-6,11-diphenyltetracene (abbreviation: BPT), and the like. Furthermore, examples of the material for red light emission include: N,N,N',N'-tetrakis(4-methylphenyl)tetracene-5,11-diamine (abbreviation: p-mPhTD), 7,14-diphenyl-N,N,N',N'-tetrakis(4-methylphenyl)acenaphtho[1,2-α]fluoranthene-3,10-diamine (abbreviation: p-mPhAFD), and the like.

As the phosphorescent compound that can be used for the layer 703 containing a light-emitting organic compound, a material for blue light emission, a material for green light emission, a material for yellow light emission, a material for orange light emission, and a material for red light emission are given. Examples of the material for blue light emission include: bis[2-(4',6'-difluorophenyl)pyridinato-N,C$^{2'}$]iridium(III)tetrakis(1-pyrazolyl)borate (abbreviation: FIr6), bis[2-(4',6'-difluorophenyl)pyridinato-N,C$^{2'}$]iridium(III)picolinate (abbreviation: FIrpic), bis{2-[3',5'-bis(trifluoromethyl)phenyl]pyridinato-N,C$^{2'}$}iridium(III) picolinate (abbreviation: Ir(CF$_3$ ppy)$_2$(pic)), bis[2-(4',6'-difluorophenyl)pyridinato-N,C$^{2'}$]iridium(III)acetylacetonate (abbreviation: FIr(acac)), and the like. Examples of the material for green light emission include: tris(2-phenylpyridinato-N,C$^{2'}$)iridium(III) (abbreviation: Ir(ppy)$_3$), bis[2-phenylpyridinato-N,C$^{2'}$]iridium (III)acetylacetonate (abbreviation: Ir(ppy)$_2$(acac)), bis(1,2-diphenyl-1H-benzimidazolato)iridium(III) acetylacetonate (abbreviation: Ir(pbi)$_2$(acac)), bis(benzo[h]quinolinato)iridium(III)acetylacetonate (abbreviation: Ir(bzq)$_2$(acac)), tris(benzo[h]quinolinato)iridium(III) (abbreviation: Ir(bzq)$_3$), and the like. Examples of the material for yellow light emission include: bis(2,4-diphenyl-1,3-oxazolato-N,C$^{2'}$)iridium(III)acetylacetonate (abbreviation: Ir(dpo)$_2$(acac)), bis[2-(4'-perfluorophenylphenyl)pyridinato]iridium(III)acetylacetonate (abbreviation: Ir(p-PF-ph)$_2$(acac)), bis(2-phenylbenzothiazolato-N,C$^{2'}$)iridium(III) acetylacetonate (abbreviation: Ir(bt)$_2$(acac)), (acetylacetonato)bis[2,3-bis(4-fluorophenyl)-5-methylpyrazinato]iridium(III) (abbreviation: Ir(Fdppr-Me)$_2$(acac)), (acetylacetonato)bis{2-(4-methoxyphenyl)-3,5-dimethylpyrazinato}iridium(III) (abbreviation: Ir(dmmoppr)$_2$(acac)), and the like. Examples of the material for orange light emission include: tris(2-phenylquinolinato-N,C$^{2'}$)iridium(III) (abbreviation: Ir(pq)$_3$), bis(2-phenylquinolinato-N,C$^{2'}$)iridium(III)acetylacetonate (abbreviation: Ir(pq)$_2$(acac)), (acetylacetonato)bis(3,5-dimethyl-2- phenylpyrazinato)iridium(III) (abbreviation: Ir(mppr-Me)$_2$(acac)), (acetylacetonato)bis(5-isopropyl-3-methyl-2-phenylpyrazinato)iridium(III) (abbreviation: Ir(mppr-iPr)$_2$(acac)), and the like. Examples of the material for red light emission include: organometallic complexes such as bis[2-(2'-benzo[4,5-α]thienyl)pyridinato-N,C$^{3'}$)iridium(III)acetylacetonate (abbreviation: Ir(btp)$_2$(acac)), bis(1-phenylisoquinolinato-N,C$^{2'}$)iridium(III)acetylacetonate (abbreviation: Ir(piq)$_2$(acac)), (acetylacetonato)bis[2,3-bis(4-fluorophenyl)quinoxalinato]iridium(III) (abbreviation: Ir(Fdpq)$_2$(acac)), (acetylacetonato)bis(2,3,5-triphenylpyrazinato)iridium(III) (abbreviation: Ir(tppr)$_2$(acac)), (dipivaloylmethanato)bis(2,3,5-triphenylpyrazinato)iridium(III) (abbreviation: Ir(tppr)$_2$(dpm)), (2,3,7,8,12,13,17,18-octaethyl-21H,23H-porphyrin)platinum(II) (abbreviation: PtOEP), and the like. In addition, a rare earth metal complex such as tris(acetylacetonato)(monophenanthroline)terbium(III) (abbreviation: Tb(acac)$_3$(Phen)), tris(1,3-diphenyl-1,3-propanedionato)(monophenanthroline)europium(III) (abbreviation: Eu(DBM)$_3$(Phen)), or tris[1-(2-thenyl)-3,3,3-trifluoroacetonato](monophenanthroline)europium(III) (abbreviation: Eu(TTA)$_3$(Phen)) exhibits light emission from a rare earth metal ion (electron transition between different multiplicities); therefore, such a rare earth metal complex can be used as the phosphorescent compound.

Note that the layer 703 containing a light-emitting organic compound may have a structure in which the above light-emitting organic compound (a guest material) is dispersed in another substance (a host material). As a host material, any of various kinds of materials can be used, and it is preferable to use a substance which has a lowest unoccupied molecular orbital level (LUMO level) of higher than that of the light-emitting organic compound and has a highest occupied molecular orbital level (HOMO level) of lower than that of the light-emitting organic compound.

Specific examples of the host material include: metal complexes such as tris(8-quinolinolato)aluminum(III) (abbreviation: Alq), tris(4-methyl-8-quinolinolato)aluminum(III) (abbreviation: Almq$_3$), bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), and bis[2-(2-benzothiazolyl)phenolato]zinc(II) (abbreviation: ZnBTZ); heterocyclic compounds such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), 2,2',2"-(1,3,5-benzenetriyl)tris(1-phenyl-1H-benzimidazole) (abbreviation: TPBI), bathophenanthroline (abbreviation: BPhen), and bathocuproine (BCP); condensed aromatic compounds such as 9-[4-(10-phenyl-9-anthryl)phenyl]-9H-carbazole (abbreviation: CzPA), 3,6-diphenyl-9-[4-(10-phenyl-9-anthryl)phenyl]-9H-carbazole (abbreviation: DPCzPA), 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl)anthracene (abbreviation: t-BuDNA), 9,9'-bianthryl (abbreviation: BANT), 9,9'-(stilbene-3,3'-diyl)diphenanthrene (abbreviation: DPNS), 9,9'-(stilbene-4,4'-diyl)diphenanthrene (abbreviation: DPNS2), 3,3',3'-(benzene-1,3,5-triyl)tripyrene (abbreviation: TPB3), 9,10-diphenylanthracene (abbreviation: DPAnth), and 6,12-dimethoxy-5,11-diphenylchrysene; aromatic amine compounds such as N,N-dipheyl-9-[4-(10-phenyl-9-anthryl)phenyl]-9H-carbazol-3-amine (abbreviation: CzA1PA), 4-(10-phenyl-9-anthryl)triphenylamine (abbreviation: DPhPA), N,9-diphenyl-N-[4-(10-phenyl-9-anthryl)phenyl]-9H-carbazol-3-amine (abbreviation: PCAPA), N,9-diphenyl-N-{4-[4-(10-phenyl-9-anthryl)phenyl]phenyl}-9H-carbazol-3-amine (abbreviation: PCAPBA), N-(9,10-diphenyl-2-anthryl)-N,9-diphenyl-9H-carbazol-3-amine (abbreviation: 2PCAPA), NPB (or α-NPD), TPD, DFLDPBi, and BSPB; and the like.

In addition, as the host material, plural kinds of materials can be used. For example, in order to suppress crystallization, a substance such as rubrene which suppresses crystallization, may be further added. In addition, NPB, Alq, or the like may be further added in order to efficiently transfer energy to the guest material.

When a structure in which a guest material is dispersed in a host material is employed, crystallization of the layer 703 containing a light-emitting organic compound can be suppressed. Further, concentration quenching due to high concentration of the guest material can be suppressed.

For the layer 703 containing a light-emitting organic compound, a high molecular compound can be used. Specifically, as a material for blue light emission, the following can be given: poly(9,9-dioctylfluorene-2,7-diyl) (abbreviation: PFO), poly[(9,9-dioctylfluorene-2,7-diyl-co-(2,5-dimethoxybenzene-1,4-diyl)] (abbreviation: PF-DMOP), poly{(9,9-dioctylfluorene-2,7-diyl)-co-[N,N'-di-(p-butylphenyl)-1,4-diaminobenzene]}(abbreviation: TAB-PFH), and the like. As a material for green light emission, the following can be given: poly(p-phenylenevinylene) (abbreviation: PPV), poly[(9,9-dihexylfluorene-2,7-diyl)-alt-co-(benzo[2,1,3]thiadiazole-4,7-diyl)] (abbreviation: PFBT), poly[(9,9-dioctyl-2,7-divinylenfluorenylene)-alt-co-(2-methoxy-5-(2-ethylhexyloxy)-1,4-phenylene)], and the like. Furthermore, as a material for orange to red light emission, the following can be given: poly[2-methoxy-5-(2'-ethylhexoxy)-1,4-phenylenevinylene] (abbreviation: MEH-PPV), poly(3-butylthiophene-2,5-diyl) (abbreviation: R4-PAT), poly{[9,9-dihexyl-2,7-bis(1-cyanovinylene)fluorenylene]-alt-co-[2,5-bis(N,N'-diphenyl amino)-1,4-phenylene]}, poly{[2-methoxy-5-(2-ethylhexyloxy)-1,4-bis(1-cyanovinylenephenylene)]-alt-co-[2,5-bis(N,N'-diphenylamino)-1,4-phenylene]} (abbreviation: CN—PPV-DPD), and the like.

Further, by providing a plurality of layers each containing a light-emitting organic compound and making the emission colors of the layers different, light emission of a desired color can be obtained from the light-emitting element as a whole. For example, in a light-emitting element including two layers each containing a light-emitting organic compound, the emission color of a first layer containing a light-emitting organic compound and the emission color of a second layer containing a light-emitting organic compound are made complementary, so that the light-emitting element as a whole can emit white light. Note that "complementary colors" refer to colors that can produce an achromatic color when being mixed. That is, emission of white light can be obtained by mixture of light emitted from substances whose emission colors are complementary colors. This can be applied to a light-emitting element including three or more layers each containing a light-emitting organic compound.

The electron-transport layer 704 is a layer containing a substance having a high electron-transport property. As the substance having a high electron-transport property, any of the following substances can be used, for example: metal complexes having a quinoline skeleton or a benzoquinoline skeleton such as tris(8-quinolinolato)aluminum (abbreviation: Alq), tris(4-methyl-8-quinolinolato)aluminum (abbreviation: Almq$_3$), bis(10-hydroxybenzo[h]-quinolinato)beryllium (abbreviation: BeBq$_2$), and bis(2-methyl-8-quinolinolato)(4-phenylphenolato)aluminum (abbreviation: BAlq). In addition, a metal complex or the like having an oxazole-based or thiazole-based ligand, such as bis[2-(2-hydroxyphenyl)benzoxazolato]zinc (abbreviation: Zn(BOX)$_2$) or bis[2-(2-hydroxyphenyl)benzothiazolato]zinc (abbreviation: Zn(BTZ)$_2$) can be used. Besides the metal complexes, 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), bathophenanthroline (abbreviation: BPhen), bathocuproine (abbreviation: BCP), or the like can also be used. The substances mentioned here are mainly substances that have an electron mobility of higher than or equal to $10^{-6}$ cm$^2$/V·s. Furthermore, the electron-transport layer is not limited to a single layer, and two or more layers made of the aforementioned substances may be stacked.

The electron-injection layer 705 is a layer containing a substance having a high electron-injection property. For the electron-injection layer 705, an alkali metal, an alkaline earth metal, or a compound thereof, such as lithium, cesium, calcium, lithium fluoride, cesium fluoride, calcium fluoride, or lithium oxide, can be used. In addition, a rare earth metal compound such as erbium fluoride can be used. Any of the above substances for forming the electron-transport layer 704 can also be used.

Note that the hole-injection layer 701, the hole-transport layer 702, the layer 703 containing a light-emitting organic compound, the electron-transport layer 704, and the electron-injection layer 705 which are described above can each be formed by a method such as an evaporation method (e.g., a vacuum evaporation method), an ink-jet method, or a coating method.

Figure 4B:
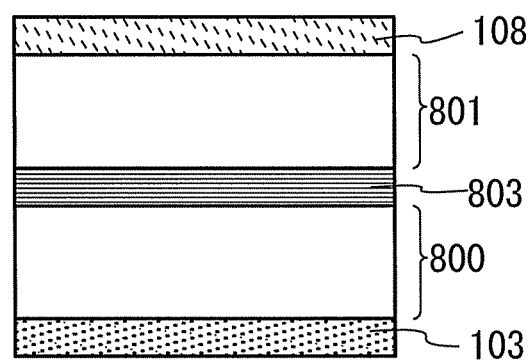

Note that a plurality of the EL layers 102 may be stacked between the first electrode 103 and the second electrode 108 as illustrated in FIG. 4B. In that case, a charge generation layer 803 is preferably provided between a first EL layer 800 and a second EL layer 801 which are stacked. The charge generation layer 803 can be formed by using the above-mentioned composite material. Further, the charge generation layer 803 may have a stacked structure including a layer containing the composite material and a layer containing another material. In that case, as the layer containing another material, a layer containing an electron-donating substance and a substance having a high electron-transport property, a layer formed of a transparent conductive film, or the like can be used. As for a light-emitting element having such a structure, problems such as energy transfer and quenching occur with difficulty, and a light-emitting element which has both high light emission efficiency and long lifetime can easily be obtained owing to expansion in the choice of materials. Moreover, a light-emitting element which provides phosphorescence from one of the EL layers and fluorescence from the other of the EL layers can readily be obtained. Note that this structure can be combined with the above-mentioned structure of the EL layer.

Further, by forming the EL layers to emit light of different colors from each other, a light-emitting element as a whole can provide light emission of a desired color. For example, by forming a light-emitting element including two EL layers such that the emission color of a first EL layer and the emission color of a second EL layer are complementary colors, the light-emitting element can provide white light emission as a whole. This can be applied to a light-emitting element including three or more EL layers.

Figure 4C:
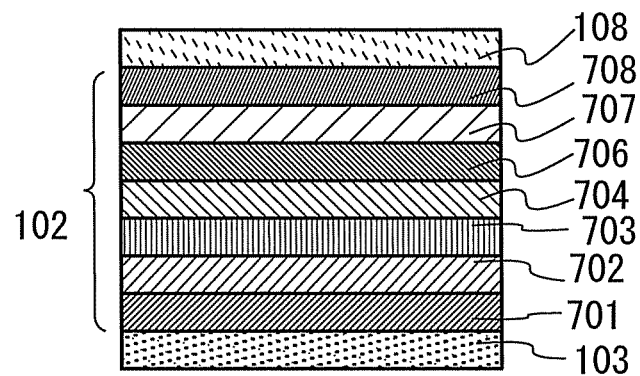

As illustrated in FIG. 4C, the EL layer 102 may include, between the first electrode 103 and the second electrode 108, the hole-injection layer 701, the hole-transport layer 702, the layer 703 containing a light-emitting organic compound, the electron-transport layer 704, an electron-injection buffer layer 706, an electron-relay layer 707, and a composite material layer 708 which is in contact with the second electrode 108.

It is preferable to provide the composite material layer 708 which is in contact with the second electrode 108, in which case damage caused to the EL layer 102 particularly when the second electrode 108 is formed by a sputtering method can be reduced. The composite material layer 708 can be formed using the above-described composite material in which an acceptor substance is added to an organic compound having a high hole-transport property.

Further, by providing the electron-injection buffer layer 706, an injection barrier between the composite material layer 708 and the electron-transport layer 704 can be reduced; thus, electrons generated in the composite material layer 708 can be easily injected to the electron-transport layer 704.

A substance having a high electron-injection property can be used for the electron-injection buffer layer 706: for example, an alkali metal, an alkaline earth metal, a rare earth metal, a compound of the above metal (e.g., an alkali metal compound (e.g., an oxide such as lithium oxide, a halide, or a carbonate such as lithium carbonate or cesium carbonate), an alkaline earth metal compound (e.g., an oxide, a halide, or a carbonate), or a rare earth metal compound (e.g., an oxide, a halide, or a carbonate) can be used.

Further, in the case where the electron-injection buffer layer 706 contains a substance having a high electron-transport property and a donor substance, the donor substance is preferably added so that the mass ratio of the donor substance to the substance having a high electron-transport property is greater than or equal to 0.001:1 and less than or equal to 0.1:1. Note that as the donor substance, an organic compound such as tetrathianaphthacene (abbreviation: TTN), nickelocene, or decamethylnickelocene can be used in addition to an alkali metal, an alkaline earth metal, a rare earth metal, a compound of the above metal (e.g., an alkali metal compound (e.g., an oxide such as lithium oxide, a halide, or a carbonate such as lithium carbonate or cesium carbonate), an alkaline earth metal compound (e.g., an oxide, a halide, or carbonate), or a rare earth metal compound (e.g., an oxide, a halide, or a carbonate)). Note that as the substance having a high electron-transport property, a material similar to the material for the electron-transport layer 704 described above can be used.

Furthermore, the electron-relay layer 707 is preferably formed between the electron-injection buffer layer 706 and the composite material layer 708. The electron-relay layer 707 is not necessarily provided; however, by providing the electron-relay layer 707 having a high electron-transport property, electrons can be rapidly transported to the electron-injection buffer layer 706.

The structure in which the electron-relay layer 707 is sandwiched between the composite material layer 708 and the electron-injection buffer layer 706 is a structure in which the acceptor substance contained in the composite material layer 708 and the donor substance contained in the electron-injection buffer layer 706 are less likely to interact with each other, and thus their functions hardly interfere with each other. Therefore, increase in drive voltage can be suppressed.

The electron-relay layer 707 contains a substance having a high electron-transport property and is formed so that the LUMO level of the substance having a high electron-transport property is between the LUMO level of the acceptor substance contained in the composite material layer 708 and the LUMO level of the substance having a high electron-transport property contained in the electron-transport layer 704. In the case where the electron-relay layer 707 contains a donor substance, the donor level of the donor substance is controlled so as to be between the LUMO level of the acceptor substance contained in the composite material layer 708 and the LUMO level of the substance having a high electron-transport property contained in the electron-transport layer 704. As for a specific value of the energy level, the LUMO level of the substance having a high electron-transport property contained in the electron-relay layer 707 is preferably higher than or equal to −5.0 eV, more preferably higher than or equal to −5.0 eV and lower than or equal to −3.0 eV.

As the substance having a high electron-transport property contained in the electron-relay layer 707, a phthalocyanine-based material or a metal complex having a metal-oxygen bond and an aromatic ligand is preferably used.

As the phthalocyanine-based material contained in the electron-relay layer 707, specifically, any of CuPc, a phthalocyanine tin(II) complex (SnPc), a phthalocyanine zinc complex (ZnPc), cobalt(II) phthalocyanine, β-form (CoPc), phthalocyanine iron (FePc), and vanadyl 2,9,16,23-tetraphenoxy-29H,31H-phthalocyanine (PhO-VOPc) is preferably used.

As the metal complex having a metal-oxygen bond and an aromatic ligand, which is contained in the electron-relay layer 707, a metal complex having a metal-oxygen double bond is preferably used. The metal-oxygen double bond has an acceptor property (a property of easily accepting electrons); thus, electrons can be transferred (donated and accepted) more easily. Further, the metal complex having a metal-oxygen double bond is considered stable. Thus, the use of the metal complex having a metal-oxygen double bond makes it possible to drive the light-emitting element at low voltage more stably.

As the metal complex having a metal-oxygen bond and an aromatic ligand, a phthalocyanine-based material is preferable. Specifically, any of vanadyl phthalocyanine (VOPc), a phthalocyanine tin(IV) oxide complex (SnOPc), and a phthalocyanine titanium oxide complex (TiOPc) is preferable because a metal-oxygen double bond is more likely to act on another molecule in terms of a molecular structure and an acceptor property is high.

Note that as the phthalocyanine-based material described above, a phthalocyanine-based material having a phenoxy group is preferable. Specifically, a phthalocyanine derivative having a phenoxy group, such as PhO-VOPc, is preferable. A phthalocyanine derivative having a phenoxy group is soluble in a solvent. Thus, a phthalocyanine derivative has an advantage of being easily handled during formation of the light-emitting element and an advantage of facilitating maintenance of an apparatus used for forming a film.

The electron-relay layer 707 may further contain a donor substance. Examples of the donor substance include an organic compound such as tetrathianaphthacene (abbreviation: TTN), nickelocene, and decamethylnickelocene, in addition to an alkali metal, an alkaline earth metal, a rare earth metal, and a compound of the above metal (e.g., an alkali metal compound (e.g., an oxide such as lithium oxide, a halide, or a carbonate such as lithium carbonate or cesium carbonate), an alkaline earth metal compound (e.g., an oxide, a halide, or a carbonate), or a rare earth metal compound (e.g., an oxide, a halide, or a carbonate)). When such a donor substance is contained in the electron-relay layer 707, electrons can be transferred easily and the light-emitting element can be driven at lower voltage.

In the case where a donor substance is contained in the electron-relay layer 707, in addition to the materials described above as the substance having a high electron-transport property, a substance having a LUMO level of higher than the acceptor level of the acceptor substance contained in the composite material layer 708 can be used. As a specific energy level, the LUMO level is higher than or equal to −5.0 eV, preferably higher than or equal to −5.0 eV and lower than or equal to −3.0 eV. Examples of such a substance include a perylene derivative and a nitrogen-containing condensed aromatic compound. Note that a nitrogen-containing condensed aromatic compound is preferably used for the electron-relay layer 707 because of its stability.

Specific examples of the perylene derivative include: 3,4,9,10-perylenetetracarboxylicdianhydride (abbreviation: PTCDA), 3,4,9,10-perylenetetracarboxylic-bis-benzimidazole (abbreviation: PTCBI), N,N'-dioctyl-3,4,9,10-perylenetetracarboxylic diimide (abbreviation: PTCDI-C8H), N,N'-dihexyl-3,4,9,10-perylenetetracarboxylic diimide (abbreviation: Hex PTC), and the like.

In addition, specific examples of the nitrogen-containing condensed aromatic compound include: pirazino[2,3-f][1,10]phenanthroline-2,3-dicarbonitrile (abbreviation: PPDN), 2,3,6,7,10,11-hexacyano-1,4,5,8,9,12-hexaazatriphenylene (abbreviation: HAT(CN)$_6$), 2,3-diphenylpyrido[2,3-b]pyrazine (abbreviation: 2PYPR), 2,3-bis(4-fluorophenyl)pyrido[2,3-b]pyrazine (abbreviation: F2PYPR), and the like.

Besides, 7,7,8,8-tetracyanoquinodimethane (abbreviation: TCNQ), 1,4,5,8-naphthalenetetracarboxylicdianhydride (abbreviation: NTCDA), perfluoropentacene, copper hexadecafluoro phthalocyanine (abbreviation: F$_{16}$CuPc), N,N'-bis(2,2,3,3,4,4,5,5,6,6,7,7,8,8-pentadecafluorooctyl-1,4,5,8-naphthalenetetracarb oxylic diimide (abbreviation: NTCDI-C8F), 3',4'-dibutyl-5,5'-bis(dicyanomethylene)-5,5"-dihydro-2,2':5',2"-terthiophen) (abbreviation: DCMT), methanofullerene (e.g., [6,6]-phenyl C$_{61}$ butyric acid methyl ester), or the like can be used.

Note that in the case where a donor substance is contained in the electron-relay layer 707, the electron-relay layer 707 may be formed by a method such as co-evaporation of the substance having a high electron-transport property and the donor substance.

The hole-injection layer 701, the hole-transport layer 702, the layer 703 containing a light-emitting organic compound, and the electron-transport layer 704 may each be fowled using any of the above-described materials.

In the above manner, the EL layer 102 of this embodiment can be manufactured.

This embodiment can be freely combined with any of other embodiments.

(Embodiment 5)

In this embodiment, an example of an organic optical device to which an embodiment of the present invention is applied will be described with reference to FIG. 11.

Figure 11:
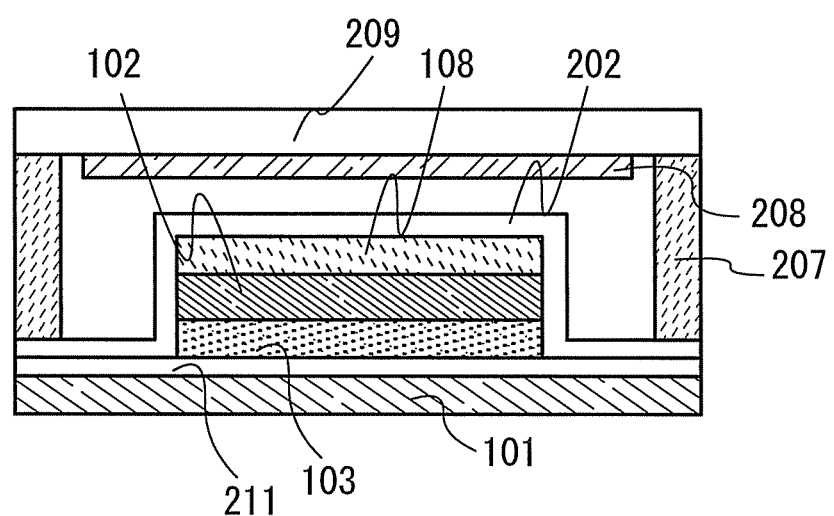
FIG. 11 illustrates an organic optical device according to an embodiment of the present invention.

An organic optical device illustrated in FIG. 11 includes a supporting body 101, a functional layer 211, a first electrode 103, an EL layer 102, a second electrode 108, a sealing film 202, a sealant 207, a desiccating agent 208, and a sealing substrate 209. Specifically, the functional layer 211 is provided over the supporting body 101, the first electrode 103 is provided over the functional layer 211, the EL layer 102 is provided over the first electrode 103, the second electrode 108 is provided over the EL layer 102, and the sealing film 202 covering the second electrode 108 is provided. The desiccating agent 208 is provided in contact with the sealing substrate 209.

The organic optical device illustrated in FIG. 11 has a structure in which the first electrode 103 formed over the supporting body 101, the EL layer 102, and the second electrode 108 are sealed between the supporting body 101 and the sealing substrate 209 with the sealant 207. The structure has a space surrounded by the sealant 207 and the space is filled with filler such as an inert gas (e.g., argon or nitrogen).

The supporting body 101, the functional layer 211, the first electrode 103, the EL layer 102, the second electrode 108, and the sealing film 202 can have structures similar to those in Embodiment 2 (FIGS. 5A and 5B).

The organic optical device illustrated in FIG. 11 includes insulating films each containing Ga or Al, Zn, and O as the functional layer 211 and the sealing film 202.

An epoxy-based resin is preferably used as the sealant 207. In addition, the material is desirably a material which does not transmit moisture or oxygen as much as possible. In addition, a sealant containing a desiccating agent can be used.

As the desiccating agent 208, a substance which absorbs moisture by chemical adsorption, such as an oxide of an alkaline earth metal (e.g., calcium oxide or barium oxide), can be used. Alternatively, a substance which adsorbs moisture by physical adsorption, such as zeolite or silica gel, may be used as the desiccating agent.

As the sealing substrate 209, a plastic substrate formed of fiberglass-reinforced plastics (FRP), polyvinyl fluoride (PVF), polyester, acrylic, or the like can be used besides a glass substrate, a quartz substrate, or a stainless steel substrate. It is particularly preferable to use a highly waterproof substrate.

The organic optical device described in this embodiment includes the insulating films each containing Ga or Al, Zn, and O so as to surround the first electrode 103, the EL layer 102, and the second electrode 108, so that entry of moisture or an impurity into an organic compound or a metal material can be suppressed.

EXAMPLE 1

In this example, an example of a film containing gallium (Ga), zinc (Zn), and oxygen (O) (hereinafter referred to as a GZO film), which can be applied to an embodiment of the present invention, will be described with reference to FIG. 6 and FIG. 7.

<<Manufacture of Sample>>

First, GZO films manufactured in this example will be described. Three kinds of GZO films shown in Table 1 were manufactured in this example.

TABLE 1

|  | $Ga_2O_3$:ZnO (molar ratio) |
|---|---|
| Structural Example 1 | 1:5 |
| Structural Example 2 | 1:1 |
| Structural Example 3 | 5:1 |

In manufacture of all the structural examples according to this example, the films were formed by a sputtering method under the following condition: the distance between a substrate and a target was 110 mm, the pressure was 0.8 Pa, the direct current (DC) power was 200 W, the atmosphere was an oxygen atmosphere, and the substrate heating temperature was 200° C.

Structural Example 1

As Structural Example 1, a GZO film with a thickness of 100 nm was formed with the use of a Ga—Zn—O-based metal oxide target ($Ga_2O_3$:ZnO=1:5 [molar ratio]).

Structural Example 2

As Structural Example 2, a GZO film with a thickness of 100 nm was formed with the use of a Ga—Zn—O-based metal oxide target ($Ga_2O_3$:ZnO=1:1 [molar ratio]).

Structural Example 3

As Structural Example 3, a GZO film with a thickness of 100 nm was formed with the use of a Ga—Zn—O-based metal oxide target ($Ga_2O_3$:ZnO=5:1 [molar ratio]).

<<Measurement of Refractive Index>>

The refractive indexes of Structural Examples 1 to 3 were measured. In this example, the refractive indexes were measured by an ellipsometry method.

Figure 6:
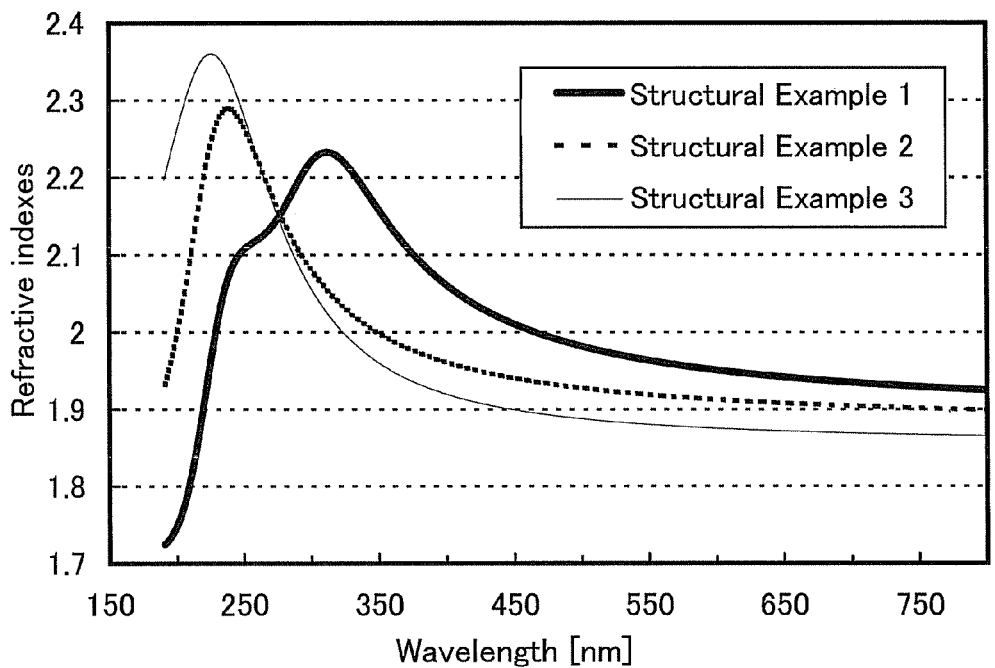
FIG. 6 shows measurement results of refractive indexes, according to Example

FIG. 6 shows the refractive indexes of Structural Examples 1 to 3. In FIG. 6, the horizontal axis indicates a wavelength (nm) and the vertical axis indicates a refractive index.

The refractive indexes of Structural Examples 1 to 3 hardly depend on the wavelength in a region (hereinafter referred to as a visible light region) where the wavelength is greater than or equal to 400 nm and less than or equal to 800 nm.

As can be seen from FIG. 6, in the visible light region, the refractive index of Structural Example 1 (formed using a target in which the percentage of ZnO is high) is higher than the refractive index of Structural Example 3 (formed using a target in which the percentage of $Ga_2O_3$ is high).

The above result indicated that varying the percentages of $Ga_2O_3$ and ZnO contained in the Ga—Zn—O-based metal oxide target caused variation in refractive index of the obtained GZO film.

<<Measurement of Transmissivity>>

Then, the transmissivities of Structural Examples 1 to 3 were measured. In this example, the transmissivities were measured by using a spectro photometer.

Figure 7:
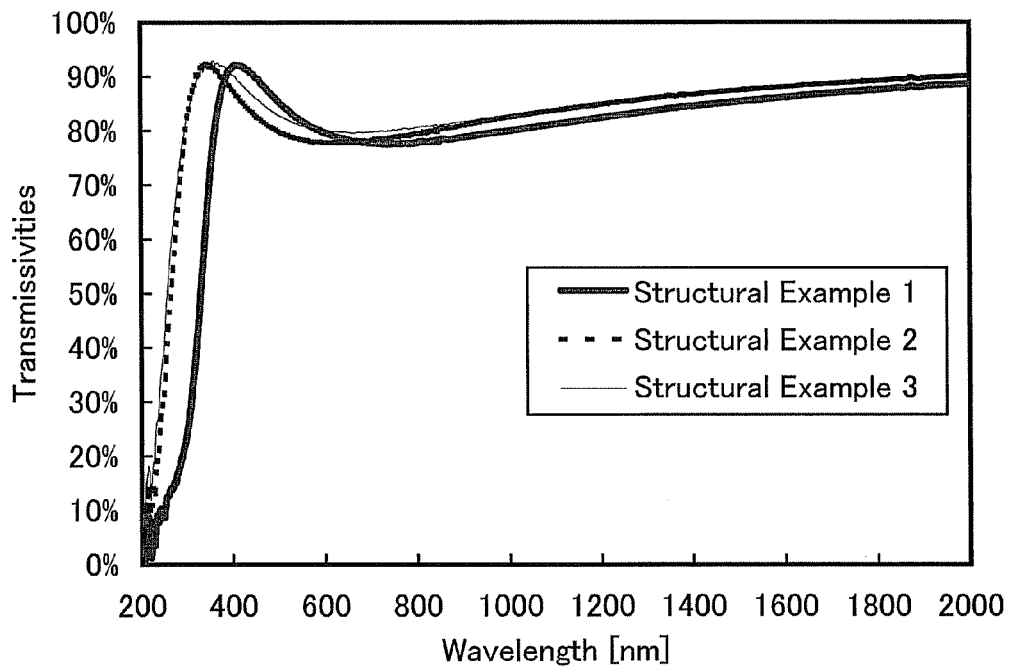
FIG. 7 shows measurement results of transmissivities, according to Example 1.

FIG. 7 shows the transmissivities of Structural Examples 1 to 3. In FIG. 7, the horizontal axis indicates a wavelength (nm) and the vertical axis indicates a transmissivity.

The transmissivities of Structural Examples 1 to 3 were as high as higher than or equal to 75% in a region where the wavelength is greater than or equal to 400 nm.

The above result showed that the GZO films had an excellent property of transmitting visible light.

As is clear from this example, a film containing Ga, Zn, and O has an excellent property of transmitting visible light. Further, by varying the percentages of Ga and Zn, the refractive index of the obtained film is greatly varied. Therefore, the film containing Ga, Zn, and O can be preferably used as a functional layer according to an embodiment of the present invention.

EXAMPLE 2

Figure 9:
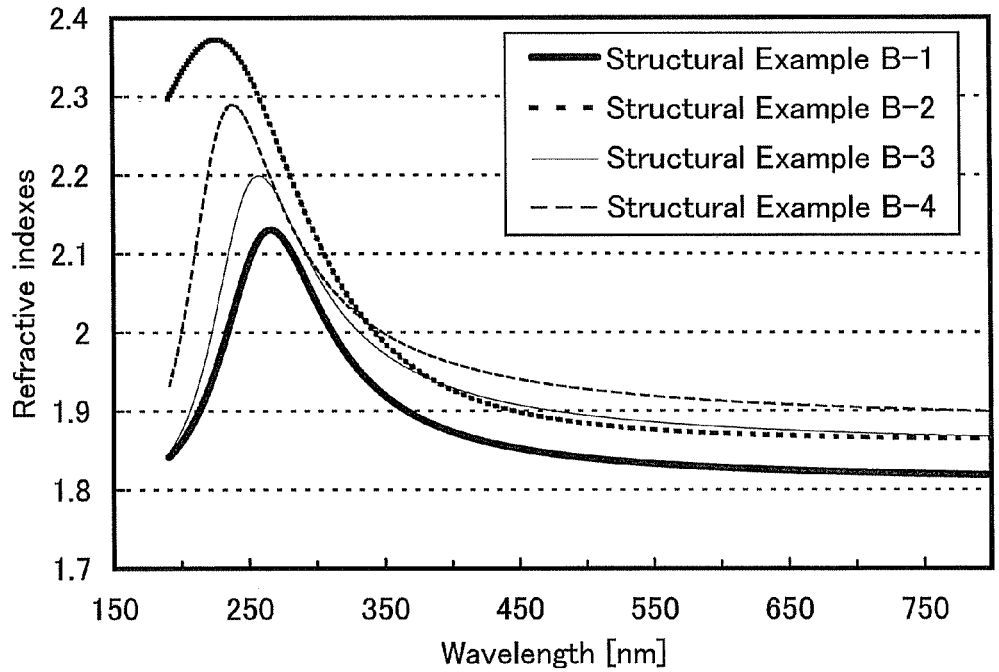
FIG. 9 shows measurement results of refractive indexes, according to Example 2.
Figure 10:
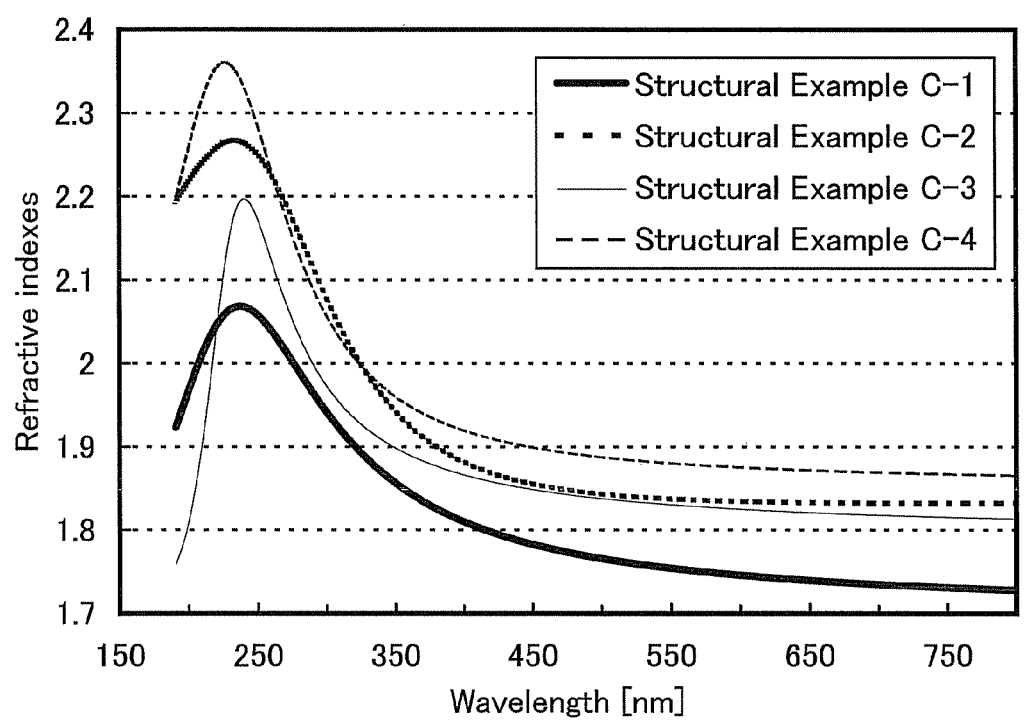
FIG. 10 shows measurement results of refractive indexes, according to Example 2

In this example, another example of a film containing Ga, Zn, and O (hereinafter referred to as a GZO film), which can be applied to an embodiment of the present invention, will be described with reference to FIG. 8, FIG. 9, and FIG. 10.

<<Manufacture of Sample>>

First, GZO films manufactured in this example will be described. In this example, 12 kinds of GZO films shown in Table 2 were manufactured.

TABLE 2

| | Ga$_2$O$_3$:ZnO (Molar Ratio) | Atmosphere for Deposition | Substrate Heating | Thickness (nm) |
|---|---|---|---|---|
| Structural Example A-1 | 1:5 | Mixture of Argon and Oxygen | Not Heated | 250 |
| Structural Example A-2 | 1:5 | Oxygen | Not Heated | 90 |
| Structural Example A-3 | 1:5 | Mixture of Argon and Oxygen | Heated | 200 |
| Structural Example A-4 | 1:5 | Oxygen | Heated | 150 |
| Structural Example B-1 | 1:1 | Mixture of Argon and Oxygen | Not Heated | 180 |
| Structural Example B-2 | 1:1 | Oxygen | Not Heated | 50 |
| Structural Example B-3 | 1:1 | Mixture of Argon and Oxygen | Heated | 150 |
| Structural Example B-4 | 1:1 | Oxygen | Heated | 90 |
| Structural Example C-1 | 5:1 | Mixture of Argon and Oxygen | Not Heated | 160 |
| Structural Example C-2 | 5:1 | Oxygen | Not Heated | 50 |
| Structural Example C-3 | 5:1 | Mixture of Argon and Oxygen | Heated | 160 |
| Structural Example C-4 | 5:1 | Oxygen | Heated | 90 |

In manufacture of all the structural examples according to this example, the films were foamed by a sputtering method under the following condition: the distance between a substrate and a target was 110 mm, the pressure was 0.8 Pa, and the direct current (DC) power was 200 W.

Structural Example A-1

As Structural Example A-1, a GZO film with a thickness of 250 nm was formed at room temperature with the use of a Ga—Zn—O-based metal oxide target (Ga$_2$O$_3$:ZnO=1:5 [molar ratio]) in a mixed atmosphere of argon and oxygen (the flow ratio was argon:oxygen=7:3).

Structural Example A-2

As Structural Example A-2, a GZO film with a thickness of 90 nm was formed at room temperature with the use of a Ga—Zn—O-based metal oxide target (Ga$_2$O$_3$:ZnO=1:5 [molar ratio]) in an oxygen atmosphere.

Structural Example A-3

As Structural Example A-3, a GZO film with a thickness of 200 nm was formed at a substrate heating temperature of 200° C. with the use of a Ga—Zn—O-based metal oxide target (Ga$_2$O$_3$:ZnO=1:5 [molar ratio]) in a mixed atmosphere of argon and oxygen (the flow ratio was argon:oxygen=7:3).

Structural Example A-4

As Structural Example A-4, a GZO film with a thickness of 150 nm was formed at a substrate heating temperature of 200° C. with the use of a Ga—Zn—O-based metal oxide target (Ga$_2$O$_3$:ZnO=1:5 [molar ratio]) in an oxygen atmosphere.

Structural Example B-1

As Structural Example B-1, a GZO film with a thickness of 180 nm was formed at room temperature with the use of a Ga—Zn—O-based metal oxide target (Ga$_2$O$_3$:ZnO=1:1 [molar ratio]) in a mixed atmosphere of argon and oxygen (the flow ratio was argon:oxygen=7:3).

Structural Example B-2

As Structural Example B-2, a GZO film with a thickness of 50 nm was formed at room temperature with the use of a Ga—Zn—O-based metal oxide target (Ga$_2$O$_3$:ZnO=1:1 [molar ratio]) in an oxygen atmosphere.

Structural Example B-3

As Structural Example B-3, a GZO film with a thickness of 150 nm was formed at a substrate heating temperature of 200° C. with the use of a Ga—Zn—O-based metal oxide target (Ga$_2$O$_3$:ZnO=1:1 [molar ratio]) in a mixed atmosphere of argon and oxygen (the flow ratio was argon:oxygen=7:3).

Structural Example B-4

As Structural Example B-4, a GZO film with a thickness of 90 nm was formed at a substrate heating temperature of 200° C. with the use of a Ga—Zn—O-based metal oxide target (Ga$_2$O$_3$:ZnO=1:1 [molar ratio]) in an oxygen atmosphere.

Structural Example C-1

As Structural Example C-1, a GZO film with a thickness of 160 nm was formed at room temperature with the use of a Ga—Zn—O-based metal oxide target (Ga$_2$O$_3$:ZnO=5:1 [molar ratio]) in a mixed atmosphere of argon and oxygen (the flow ratio was argon:oxygen=7:3).

Structural Example C-2

As Structural Example C-2, a GZO film with a thickness of 50 nm was formed at room temperature with the use of a Ga—Zn—O-based metal oxide target (Ga$_2$O$_3$:ZnO=5:1 [molar ratio]) in an oxygen atmosphere.

Structural Example C-3

As Structural Example C-3, a GZO film with a thickness of 160 nm was formed at a substrate heating temperature of 200° C. with the use of a Ga—Zn—O-based metal oxide target (Ga$_2$O$_3$:ZnO=5:1 [molar ratio]) in a mixed atmosphere of argon and oxygen (the flow ratio was argon:oxygen=7:3).

Structural Example C-4

As Structural Example C-4, a GZO film with a thickness of 90 nm was formed at a substrate heating temperature of 200° C. with the use of a Ga—Zn—O-based metal oxide target (Ga$_2$O$_3$:ZnO=5:1 [molar ratio]) in an oxygen atmosphere.

<<Measurement of Refractive Index>>

Then, the refractive indexes of Structural Examples A-1 to A-4, Structural Examples B-1 to B-4, and Structural Examples C-1 to C-4 were measured.

The refractive indexes were measured by a method similar to that in Example 1.

Figure 8:
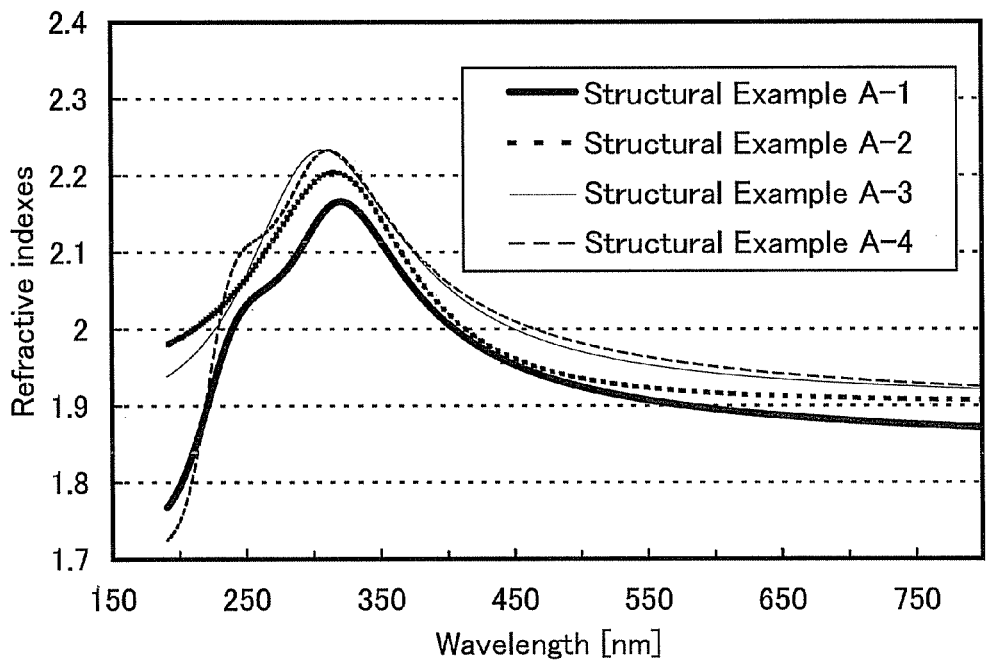
FIG. 8 shows measurement results of refractive indexes, according to Example 2.

FIG. 8 shows the refractive indexes of Structural Examples A-1 to A-4. FIG. 9 shows the refractive indexes of Structural Examples B-1 to B-4. FIG. 10 shows the refractive indexes of Structural Examples C-1 to C-4. In each of FIG. 8, FIG. 9, and FIG. 10, the horizontal axis indicates a wavelength (nm) and the vertical axis indicates a refractive index.

The refractive indexes of Structural Examples manufactured in this example hardly depend on the wavelength in the visible light region.

The results of this example show that by varying the percentages of Ga and Zn or conditions such as an atmosphere for forming a film, the refractive index of the obtained GZO film is greatly varied. For example, a GZO film having a refractive index of higher than or equal to 1.7 and lower than or equal to 2.0 in the visible light region can be foamed.

This application is based on Japanese Patent Application serial no. 2010-261784 filed with Japan Patent Office on Nov. 24, 2010, the entire contents of which are hereby incorporated by reference.

What is claimed is:

1. An organic optical device comprising:
a supporting body;
a functional layer comprising an insulating film, over the supporting body; and
a light-emitting body comprising an organic compound, over the functional layer,
wherein the insulating film comprises a composition of gallium, zinc, and oxygen,
wherein the insulating film comprises at least one of a Ga—Zn—O-based material, a Ga—Zn—O—N-based material, a Ga—Al—Zn—O-based material, and a Ga—Al—Zn—O—N-based material, and
wherein the supporting body and the functional layer each have a property of transmitting light with a wavelength in a region where the wavelength is greater than or equal to 400 nm and less than or equal to 700 nm.

2. The organic optical device according to claim 1, wherein in the insulating film, a total atomic proportion of elements other than gallium, zinc, oxygen, and nitrogen is less than or equal to 0.1.

3. The organic optical device according to claim 1, wherein a specific resistance of the insulating film is higher than or equal to $10^{10}$ Ωcm at 20° C.

4. The organic optical device according to claim 1, further comprising a sealing film covering the light-emitting body,
wherein the sealing film is in contact with the functional layer and a side surface of the light-emitting body,
wherein the light-emitting body is sealed by the sealing film and the functional layer,
wherein the sealing film comprises gallium, zinc, and oxygen, and
wherein the sealing film comprises at least one of a Ga—Zn—O-based material, a Ga—Zn—O—N-based material, a Ga—Al—Zn—O-based material, and a Ga—Al—Zn—O—N-based material.

5. The organic optical device according to claim 1, further comprising a sealing film covering the light-emitting body,
wherein the composition of the insulating film is the same as a composition of the sealing film.

6. The organic optical device according to claim 1, wherein the insulating film is configured to prevent entry of moisture or an impurity into the light-emitting body.

7. The organic optical device according to claim 1,
wherein one surface of the supporting body has a first uneven structure, and
wherein the other surface of the supporting body has a second uneven structure.

8. An organic optical device comprising:
a supporting body;
a functional layer comprising an insulating film, over the supporting body;
a first electrode over the functional layer;
a layer comprising a light-emitting organic compound over the first electrode; and
a second electrode over the layer comprising the light-emitting organic compound,
wherein the insulating film comprises a composition of gallium, zinc, and oxygen,
wherein the insulating film comprises at least one of a Ga—Zn—O-based material, a Ga—Zn—O—N-based material, a Ga—Al—Zn—O-based material, and a Ga—Al—Zn—O—N-based material, and
wherein the supporting body, the functional layer, and the first electrode each have a property of transmitting light with a wavelength in a region where the wavelength is greater than or equal to 400 nm and less than or equal to 700 nm.

9. The organic optical device according to claim 8, further comprising a sealing film covering the second electrode,
wherein the sealing film is in contact with the functional layer and side surfaces of the first electrode, the layer comprising the light-emitting organic compound, and the second electrode,
wherein the first electrode, the layer comprising the light-emitting organic compound, and the second electrode are sealed by the sealing film and the functional layer,
wherein the sealing film comprises a composition of gallium, zinc, and oxygen, and
wherein the sealing film comprises at least one of a Ga—Zn—O-based material, a Ga—Zn—O—N-based material, a Ga—Al—Zn—O-based material, and a Ga—Al—Zn—O—N-based material.

10. The organic optical device according to claim 8, wherein in the insulating film, a total atomic proportion of elements other than gallium, zinc, oxygen, and nitrogen is less than or equal to 0.1.

11. The organic optical device according to claim 8, wherein a specific resistance of the insulating film is higher than or equal to $10^{10}$ Ωcm at 20° C.

12. The organic optical device according to claim 8, further comprising a sealing film covering the second electrode,
wherein the composition of the insulating film is the same as a composition of the sealing film.

13. The organic optical device according to claim 8, wherein the insulating film is configured to prevent entry of moisture or an impurity into the layer comprising the light-emitting organic compound.

14. The organic optical device according to claim 8,
wherein one surface of the supporting body has a first uneven structure, and
wherein the other surface of the supporting body has a second uneven structure.

15. A protective component of an organic optical device, comprising:
a functional layer comprising an insulating film, the insulating film comprising a composition of gallium, zinc, and oxygen;
a first film in contact with one surface of the functional layer; and
a second film in contact with the other surface of the functional layer,
wherein the insulating film comprises at least one of a Ga—Zn—O-based material, a Ga—Zn—O—N-based material, a Ga—Al—Zn—O-based material, and a Ga—Al—Zn—O—N-based material,
wherein the protective component has a property of transmitting light with a wavelength in a region where the wavelength is greater than or equal to 400 nm and less than or equal to 700 nm, and wherein a difference in refractive index between a first layer in the functional layer and a second layer in contact with the first layer in the functional layer is less than or equal to 0.2.

16. The protective component of an organic optical device, according to claim 15, wherein in the insulating film, a total atomic proportion of elements other than gallium, zinc, oxygen, and nitrogen is less than or equal to 0.1.

17. The protective component of an organic optical device, according to claim 15, wherein a specific resistance of the insulating film is higher than or equal to $10^{10}$ Ωcm at 20° C.

18. An organic optical device comprising:
the protective component of an organic optical device, according to claim 15; and
a light-emitting body comprising an organic compound over the protective component of an organic optical device.

19. An organic optical device comprising:
the protective component of an organic optical device, according to claim 15;
a layer comprising a light-emitting organic compound over the protective component of an organic optical device; and
a second electrode over the layer comprising the light-emitting organic compound,
wherein the second film functions as a first electrode.

20. The organic optical device according to claim 19, further comprising a sealing film covering the second electrode,
wherein the sealing film is in contact with the functional layer and side surfaces of the layer comprising the light-emitting organic compound and the second electrode,
wherein the second film, the layer comprising the light-emitting organic compound, and the second electrode are sealed by the sealing film and the functional layer,
wherein the sealing film comprises a composition of gallium, zinc, and oxygen, and
wherein the sealing film comprises at least one of a Ga—Zn—O-based material, a Ga—Zn—O—N-based material, a Ga—Al—Zn—O-based material, and a Ga—Al—Zn—O—N-based material.

21. The organic optical device according to claim 19, wherein a refractive index of a layer in the functional layer, a refractive index of the first film, and a refractive index of the second film are each higher than or equal to a refractive index of the layer comprising the light-emitting organic compound.

22. The organic optical device according to claim 19, further comprising an uneven structure adjacent to the first film.

23. The protective component of an organic optical device, according to claim 15, wherein the insulating film is configured to prevent entry of moisture or an impurity.

* * * * *